United States Patent
Aritomi et al.

(10) Patent No.: US 6,504,744 B2
(45) Date of Patent: Jan. 7, 2003

(54) SEMICONDUCTOR MEMORY DEVICE WITH MEMORY TEST CIRCUIT

(75) Inventors: Kengo Aritomi, Hyogo (JP); Mikio Asakura, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 26 days.

(21) Appl. No.: 09/736,501

(22) Filed: Dec. 15, 2000

(65) Prior Publication Data
US 2001/0053086 A1 Dec. 20, 2001

(30) Foreign Application Priority Data
Jun. 9, 2000 (JP) .................................. 2000-173776

(51) Int. Cl.[7] ................................................ G11C 5/06
(52) U.S. Cl. .................... 365/63; 365/200; 365/201; 365/210
(58) Field of Search ...................... 365/63, 200, 201, 365/210

(56) References Cited

U.S. PATENT DOCUMENTS

| 5,652,725 A | * | 7/1997 | Suma et al. ................. 365/200 |
| 5,815,449 A | * | 9/1998 | Taura ......................... 365/200 |
| 6,104,630 A | * | 8/2000 | Hidaka ........................ 365/63 |
| 6,320,800 B1 | * | 11/2001 | Saito et al. ................. 365/200 |

FOREIGN PATENT DOCUMENTS

| JP | 2-108300 | 4/1990 |
| JP | 2-310900 | 12/1990 |
| JP | 6-119777 | 4/1994 |
| JP | 10-233100 | 9/1998 |

* cited by examiner

Primary Examiner—David Nelms
Assistant Examiner—Connie C. Yoha
(74) Attorney, Agent, or Firm—McDermott, Will & Emery

(57) ABSTRACT

A semiconductor memory device includes a plurality of array blocks including word lines, memory cells, bit lines, dummy word lines and transistors. In a test mode, rather than a word line a dummy word line is selected. Selectively turning on either one of the transistors allows a bit line connected thereto to be driven to a ground potential. Thus, a channel leak can be detected. In a mode other than the test mode, a defective word line is substituted by a spare word line included in a spare block.

11 Claims, 36 Drawing Sheets

SEMICONDUCTOR MEMORY DEVICE WITH MEMORY TEST CIRCUIT

BACKGROUND OF THE INVENTION

1. Field of the Invention

The present invention relates generally to semiconductor memory devices and particularly to configurations provided for testing a memory cell.

2. Description of the Background Art

As a conventional test conducted on a semiconductor memory device, a disturb test is conducted to estimate memory leakage.

The disturb test is conducted in various manners and in one such disturb test any single word line in a subarray is turned on/off to conduct the test. Hereinafter, the test employing turning on/off a single word line in a subarray will be referred to as an end page read refresh.

In the end page read refresh, a word line is turned on/off to allow a bit line to have a potential with an amplitude interfering with a memory cell connected to the bit line (the word line to which the memory cell is connected is placed in the inactive state). The bit line's potential amplitude allows the word line to slightly float to detect a channel leak.

In addition to the above effect, the memory cell's data (for example of logical high) and the connected bit line's potential (for example of logical low) are opposite in phase. As such in a memory cell transistor having a processing defect a channel leak can readily occur.

Thus, the end page read refresh only requires a single word line to be turned on/off in a subarray and can thus be conducted in a shorter period of time than a normal disturb test.

If in a semiconductor memory device having a redundant configuration the end page read refresh turns on/off a word line corresponding to a defective word line, rather than the defective word line is not turned on/off and a spare word line is instead turned on/off.

The redundant configuration divided in two types, i.e., a configuration substituting a defective word line in a subarray with a spare word line in the same subarray and a configuration substituting a defective word line in a subarray with a spare word line in a different subarray. The latter configuration is referred to as flexible redundancy.

In the flexible redundancy configuration, however, it is possible that rather than a defective word line a spare word line is turned on/off that exists in a subarray different from the subarray including the defective word line.

As such, it is possible in the flexible redundancy configuration that a channel leak is not detected in a subarray including a defective word line.

SUMMARY OF THE INVENTION

The present invention therefore contemplates a semiconductor memory device capable of reliably testing a memory whether or not it has a redundant configuration.

The present invention in one aspect provides a semiconductor memory device including: a memory cell array portion including a plurality of memory cells arranged in rows and columns, a plurality of normal word lines provided corresponding to a plurality of rows, a plurality of bit lines provided corresponding to a plurality of columns, and a spare word line provided for substituting for a defective normal word line of the plurality of normal word lines; a test circuit including a dummy word line and a drive circuit operating to amplify a voltage level of the plurality of bit lines depending on the dummy word line; a decision circuit referring to an address input, to determine whether or not to substitute a selected normal word line with the spare word line; and a select diive circuit operating in a test mode to selectively drive the dummy word line rather than the plurality of normal word lines and the spare word line, and operating in a mode other than the test mode to refer to a decision of the decision circuit to selectively drive a corresponding normal word line or a corresponding spare word line.

Preferably the drive circuit includes a plurality of transistors arranged for the plurality of bit lines, respectively, the plurality of transistors each responding to a potential of the dummy word line by driving a corresponding bit line to a predetermined potential.

In particular, the predetermined potential is determined depending on data written to a memory cell and the plurality of transistors drive their respective bit lines to either one of a ground potential and a power supply potential.

Preferably the semiconductor memory device further includes a dummy formation region formed at an outermost periphery of a region provided with the memory cell array portion, wherein the test circuit is provided in the dummy formation region.

Preferably the semiconductor memory device further includes a dummy formation region provided at an outermost periphery of a region provided with the memory cell array portion, wherein the plurality of transistors are provided in the dummy formation region.

Preferably the plurality of normal word lines are divided into a plurality of array blocks and there are provided more than one spare word line, and in a mode other than the test mode the defective normal word line in each of the plurality of array blocks is substituted by any one of more than one spare word line arranged in a spare block formed in a region different than the plurality of array blocks. In particular the drive circuit is arranged only in the plurality of array blocks.

Preferably there are provided more than one spare word line, the plurality of memory cells, the plurality of normal word lines and more than one spare word line are divided in a plurality of array blocks and the defective normal word line in each of the plurality of array blocks is substituted by a spare word line existing in the same array block.

Preferably the semiconductor memory device further includes a test mode setting circuit operable to set the test mode, wherein the select drive circuit operates to allow the plurality of transistors to be each operable only in the test mode.

Thus the semiconductor memory device can be provided with a test circuit including a dummy word line selected in the end page read refresh mode in place of a normal word line and a spare word line and a drive circuit operable to amplify a level in voltage of a bit line depending on the dummy word line, to ensure that in the test a channel leak is detected.

In particular, the drive circuit can be configured of a transistor. Furthermore the transistor can drive a bit line to a potential allowing a channel leak to be detected, such as a ground potential, a power supply potential and the like.

Furthermore, the dummy word line and the transistor can be formed in a dummy formation region located at an outermost periphery of a region provided with an array block. As such a chip area can be reduced.

Furthermore, even if a semiconductor memory device has a flexible redundancy configuration, a dummy word line can be selected whether or not substitution has been provided. Thus the memory can be tested reliably.

In particular, if a semiconductor memory device has a flexible redundancy configuration a dummy word line is not provided in a block including a spare word line. Thus a chip area can be reduced.

Furthermore, even if a semiconductor memory device has a redundant configuration other than a flexible redundancy configuration the memory can also be tested reliably.

In a mode other than the end page read refresh mode the transistor does not operate. Thus in the mode other than the end page read refresh mode a normal word line or a spare word line can be used in reading/writing data, as conventional.

Furthermore the dummy word line and the transistor can be formed in a dummy formation region positioned in an outermost periphery of a region in which the array block. Thus a chip area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
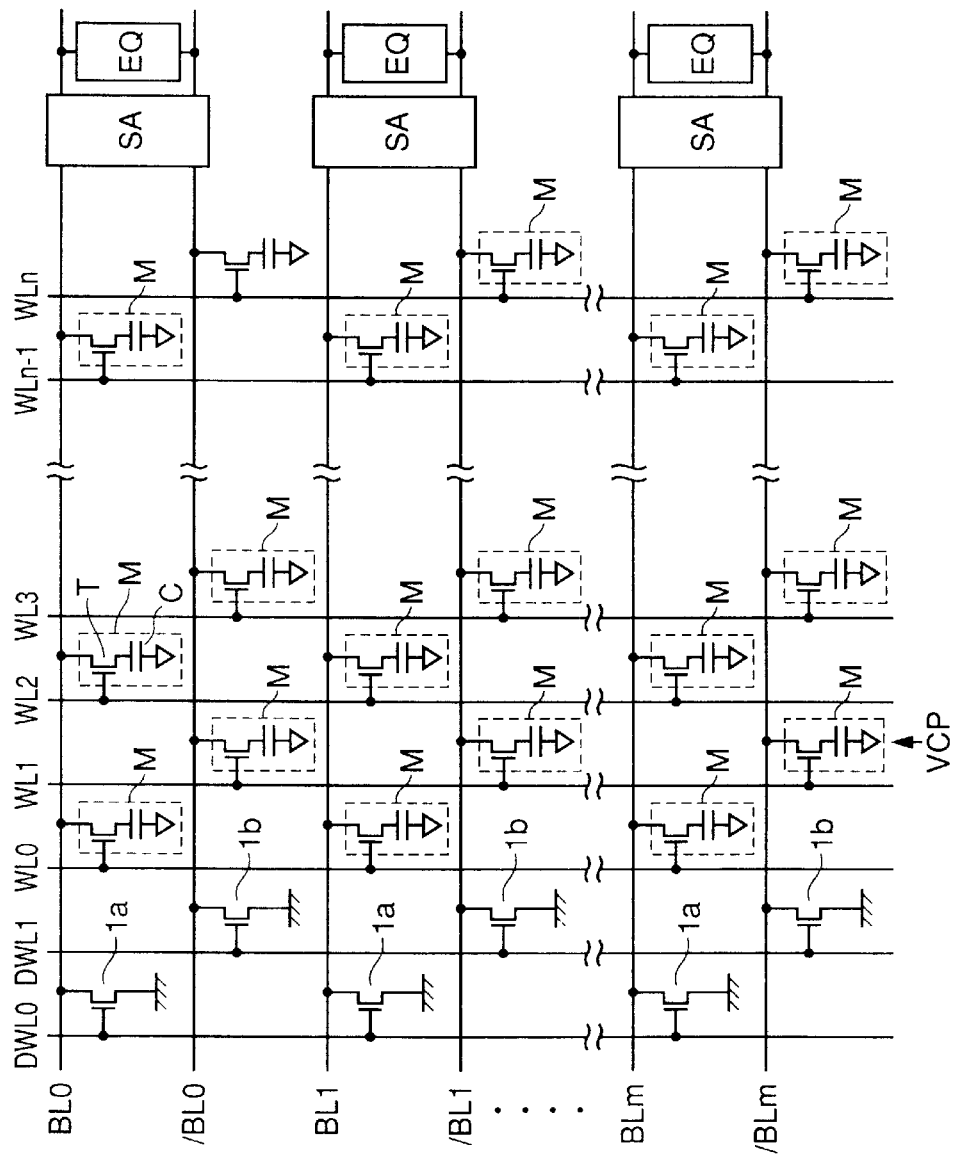
FIG. 1 illustrates a configuration of an array block including a normal word line in a first embodiment of the present invention.

Hereinafter the embodiments of the present invention will be specifically described with reference to the drawings. In the figures, like portions are labeled like reference characters and a description thereof will not be repeated.

First Embodiment

In a first embodiment a semiconductor memory device is provided as will now be described with reference to FIGS.

1–3. The present semiconductor memory device includes array blocks A(1) to A(N–1) including a normal word line and an array block A(N) including a spare word line provided to substitute for a defective word line.

Array blocks A(1) to A(N–1), as shown in FIG. 1, each include a plurality of normal memory cells Ms arranged in rows and columns, normal word lines WL1–WLn arranged in the direction of the rows, and bit lines BL0 and /BL0, BL1 and /BL1, . . . , BLm and /BLm arranged in the direction of the columns.

Normal memory cell M includes a transistor T and a capacitor C. Transistor T has one conduction terminal connected to a corresponding bit line and the other conduction terminal connected to capacitor C at one terminal (a storage node), and the gate connected to a corresponding word line. Capacitor C has the other terminal (a cell plate) receiving a cell plate voltage VCP.

For each of bit line pairs BL0 and /BL0, BL1 and /BL1, . . . , and BLm and /BLm there are arranged a sense amplifier SA for amplifying a potential difference and a precharge and equalization circuit EQ for equalizing the bit lines and precharging them to a predetermined potential. In read/write operation, precharge and equalization circuit EQ equalizes bit lines and precharges them to a predetermined potential before data is read or written.

Array blocks A(1) to A(N–1) each also include a transistor $1a$ arranged for a bit line BLi, wherein i=0, . . . , m, a transistor $1b$ arranged for a bit line /BLi, wherein i=0, . . . , m, and dummy word lines DWL0, DWL1 arranged in the direction of the rows.

Transistors $1a$, $1b$ each have one conduction terminal connected to a ground voltage GND and the other conduction terminal connected to a corresponding bit line, and the gate connected to a corresponding dummy word line.

Figure 2:
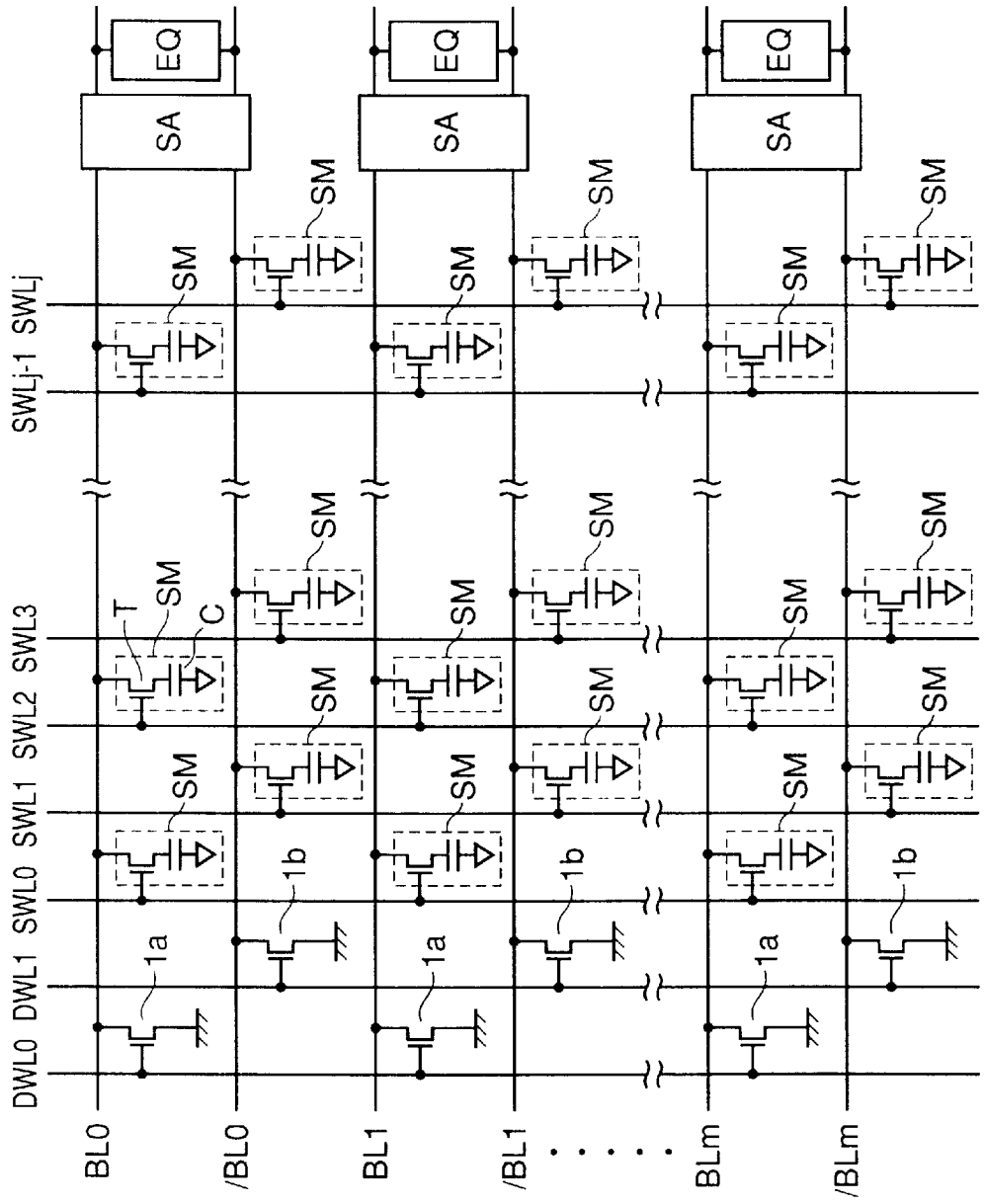
FIG. 2 illustrates a configuration of an array block including a spare word line in the first embodiment.

Array block A(N), as shown in FIG. 2, includes a plurality of spare memory cells SMs arranged in rows and columns, spare word lines SWL1–SWLj arranged in the direction of the rows, and bit lines BL0 and /BL0, BL1 and /BL1, . . . , and BLm and /BLm arranged in the direction of the columns.

As well as normal memory cell M, spare memory cell SM is also configured of transistor T and capacitor C.

Array block A(N) also includes transistor la arranged for bit line BLi, wherein i=0, . . . , m, transistor $1b$ arranged for bit line /BLi, wherein i=0, . . . , m, and dummy word line DWL0, DWL1 arranged in the direction of the rows.

In array block A(N), as well as array blocks A(1) to A(N–1), transistors $1a$ and $1b$ each have one conduction terminal connected to ground voltage GND and the other conduction terminal connected to a corresponding bit line, and the gate connected to a corresponding dummy word line.

Hereinafter, normal memory cell M and spare memory cell SM will be generally referred to as a memory cell, and normal word line WL and a spare word line will be generally referred to as a word line.

Figure 3:
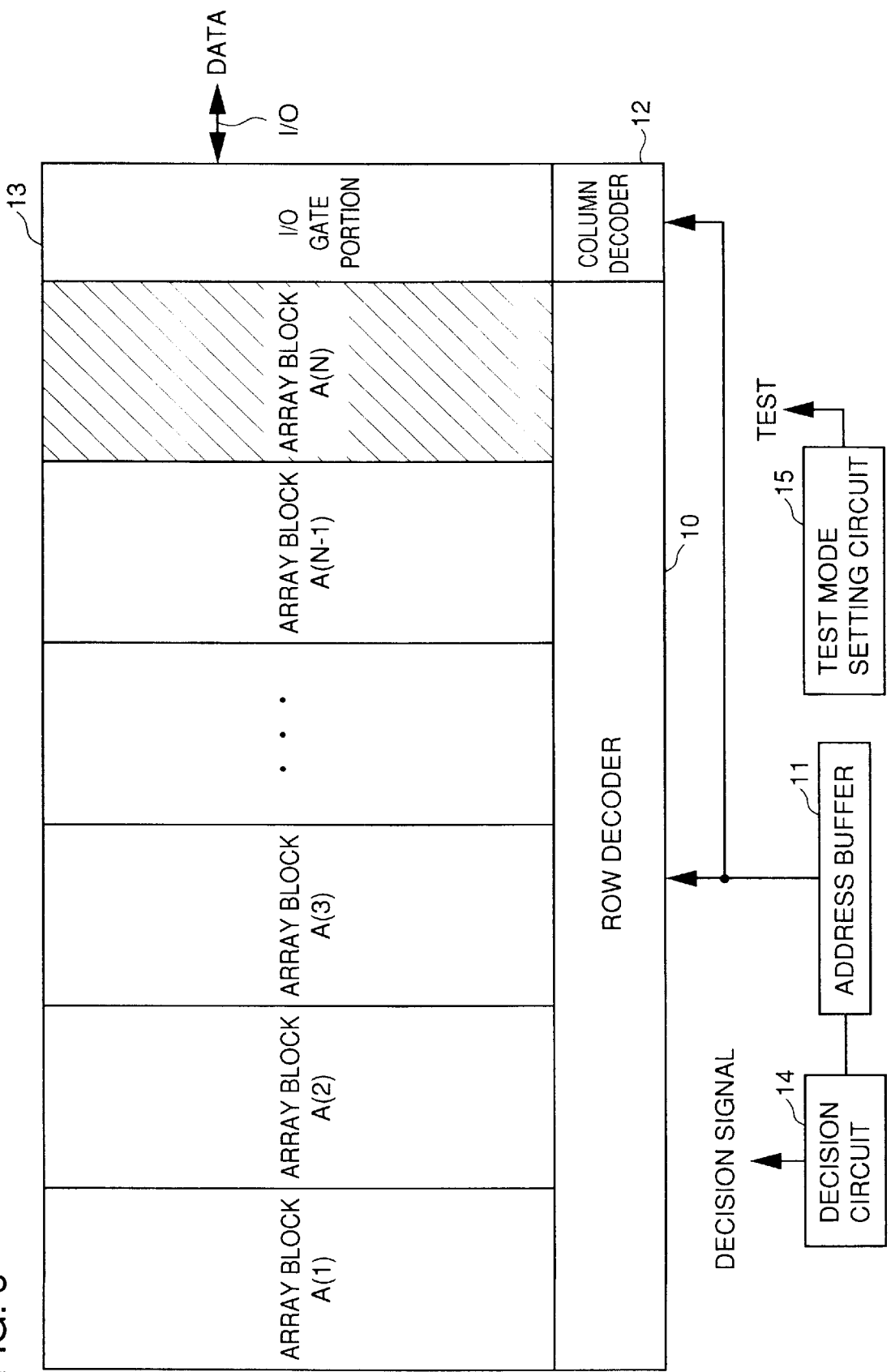
FIG. 3 is a block diagram generally showing a configuration of a semiconductor memory device in the first embodiment.

In the first embodiment the semiconductor memory device generally operates as will now be described with reference to FIGS. 1–3. With reference to FIG. 3, in the normal mode of operation a row decoder 10 performs a row select operation according to an internal address output from an address buffer 11. When a row is selected, based on the data of a memory cell arranged in the selected row a bit line's potential varies. The sense amplifier amplifies the bit line pair's potential difference. A column decoder 12 responds to an output from address buffer 11 by outputting a column select signal CSL to select a column. An I/O gate portion 13 responds to column select signal CSL by electrically connecting a data input/output line I/O and a selected column together. Thus, data is read from a memory cell and output via data input/output line I/O or data is written to a memory cell.

Decision circuit 14 compares an address input with the address of a defective word line previously programmed. If the input address designates a defective word line, decision circuit 14 outputs a decision signal to select a spare. In response to the decision signal, row decoder 10 operates to select a spare word line substituting for the defective word line.

In the end page read refresh, a test mode setting circuit 15 outputs a test signal TEST. In response to test signal TEST, row decoder 10 selects a dummy word line. When transistor $1a$ or $1b$ connected to the selected dummy word line is turned on, a bit line to which transistor $1a$ or $1b$ is connected is driven to ground potential GND.

Turning on/off transistor $1a$ or $1b$ applies stress on a memory cell connected to the same bit line as the transistor and having data of logical high written therein.

Figure 4:
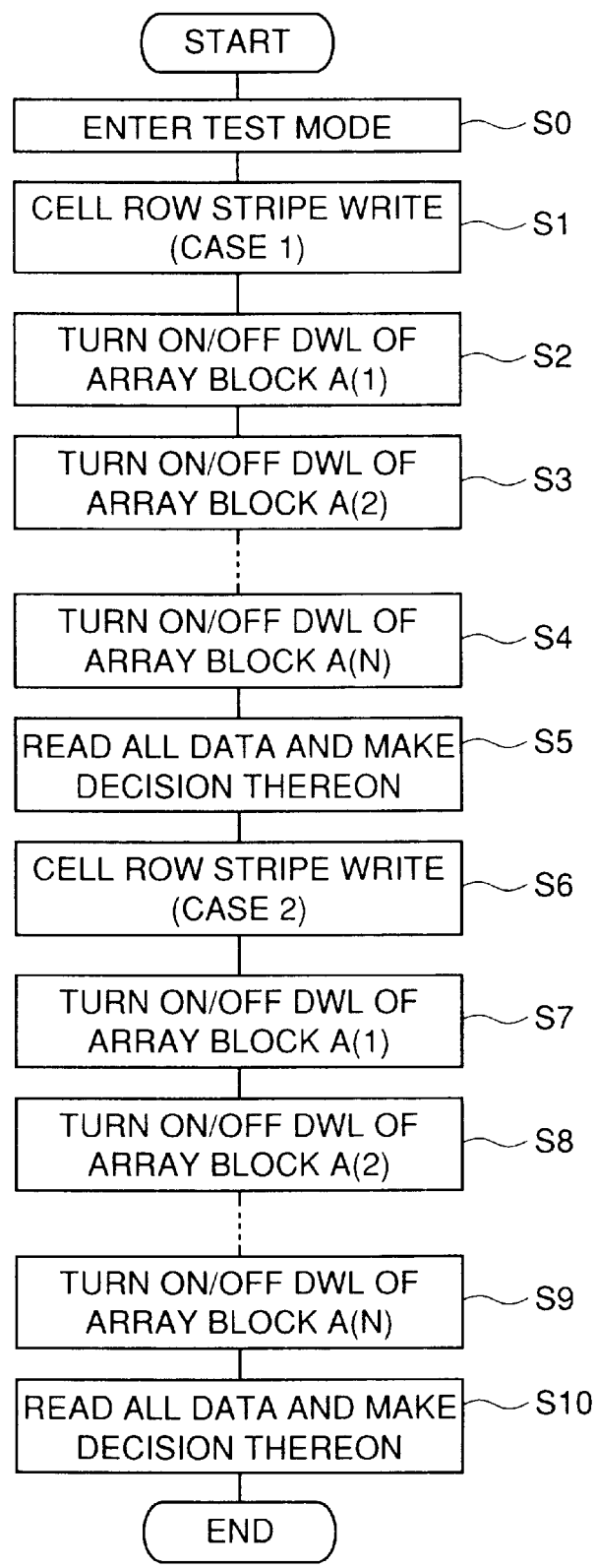
FIG. 4 is a flow chart of an end page read refiesh of the semiconductor memory device in the first embodiment.

A description will now be made of the flow and content of the end page read refresh in the first embodiment. With reference to FIG. 4, at step S0 the test mode is entered. At step S1, data is written in all array blocks (case 1). More specifically, high level data and low level data are alternately written in the direction of the rows (Cell Row Stripe Write).

Figure 5:
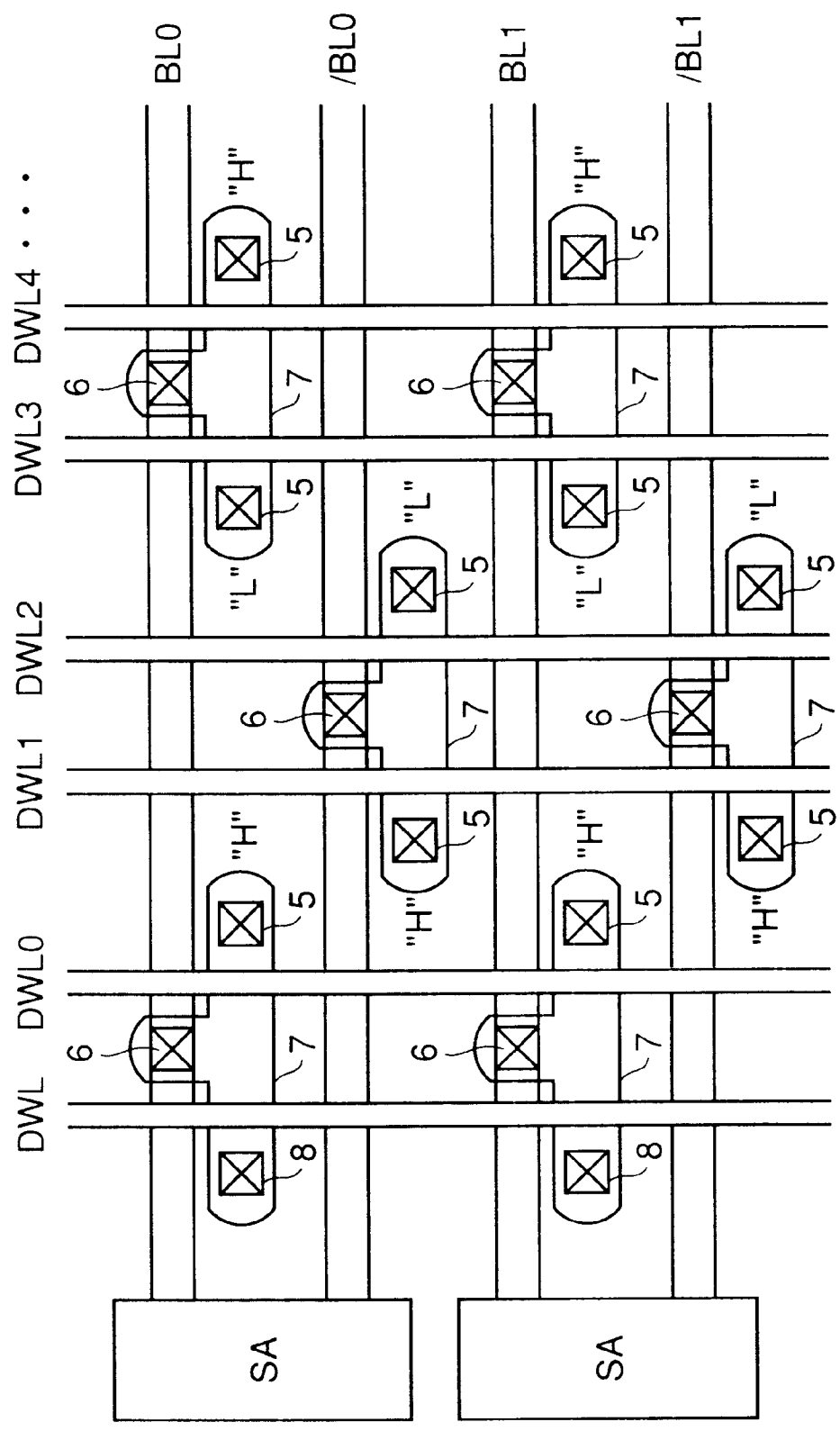
FIG. 5 illustrates data written in an array block in the end page read refresh.

One example of the cell row stripe write is shown in FIG. 5. In the figure, reference character DWL denotes a dummy word line (DWL0 or DWL1), a reference numeral 5 denotes a storage node contact in capacitor C included in normal memory cell M, a reference numeral 6 denotes a bit line contact, a reference numeral 7 denotes a drain/source region, and a reference numeral 8 denotes a node feeding ground voltage GND to a transistor ($1a$ or $1b$).

For example, in case 1 high level data is written to normal memory cell M having the gate connected to word lines WL0 and WL1. Furthermore, low level data is written to normal memory cell M having the gate connected to adjacent word lines WL2 and WL3. Similarly, for each word line high or low level data is written to normal memory cell M.

With reference to FIG. 4, at step S2, for array block A(1) a dummy word line is turned on/off repeatedly. For example, dummy word line DWL0 is turned on/off repeatedly. This applies stress on normal memory cell M connected to bit lines BL0, BL1, . . .

Then, at step S3, for array block A(2) one dummy word line is turned on/off repeatedly. Subsequently, for array blocks A(3) to A(N–1) successively one dummy word line is turned on/off repeatedly. Then, at step S4, for array block A(N) one dummy word line is turned on/off repeatedly. This applies stress on spare memory cell SM.

At step S5, all array blocks have their data read. Then a tester is used to determine whether the read data match an expected value (write data: case 1). If there is a channel leak, the read data is different from the expected value. Thus, half the memory cells are tested.

Then, at step S6, cell row stripe write (case 2) is provided. In case 2 is written an inverted version of the data written in case 1. As such, in the FIG. 5 example, low level data is written to normal memory cell M having the gate connected to word lines WL0 and WL1. Furthermore, high level data is written to normal memory cell M having the gate connected to adjacent word lines WL2 and WL3. For each word line the inverted version of the case 1 data is written to a memory cell.

With reference to FIG. 4, at step S7, for array block A(1) a dummy word line is turned on/off repeatedly. For example, dummy word line DWL1 is turned on/off repeatedly. This applies stress on normal memory cell M connected to bit lines /BL0, /BL1, . . . .

Then, at step S8, for array block A(2) one dummy word line is turned on/off repeatedly. Subsequently, for array blocks A(3) to A(N-1) successively one dummy word line is turned on/off repeatedly. Then, at step S9, for array block A(N) one dummy word line is turned on/off repeatedly. This applies stress on spare memory cell SM.

At step S10, all array blocks have their data read. Then a tester is used to determine whether the read data match an expected value (write data: case 2). If there is a channel leak, the read data is different from the expected value. Thus, the remaining half of the memory cells are tested.

Figure 36:
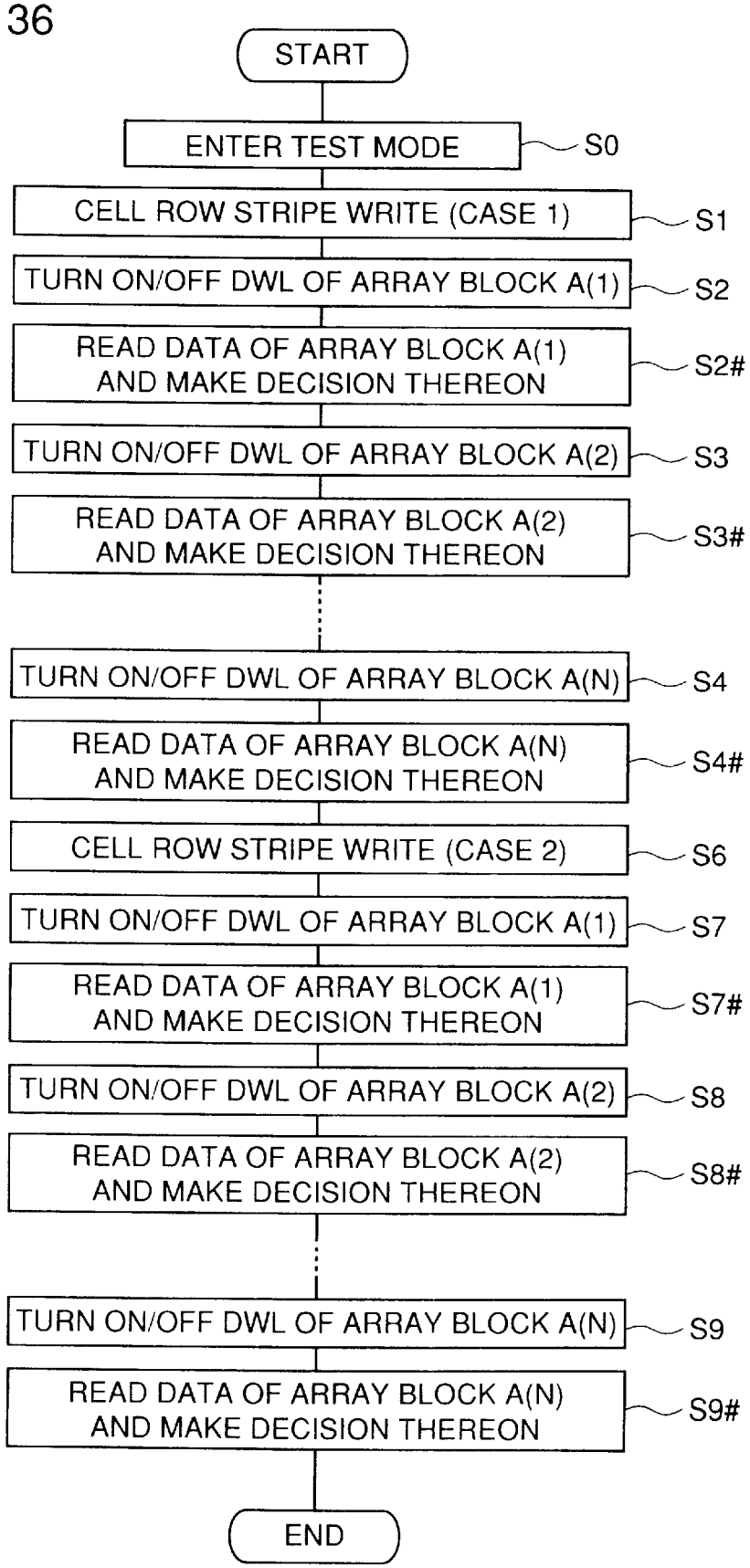
FIG. 36 is a flow chart of another example of the end page read refresh of the semiconductor memory device in the first embodiment.

It should be noted that the end page read refresh is not limited to the FIG. 4 flow and it may alternatively be the FIG. 36 flow. With reference to FIG. 36, at step S0 a test mode is entered. At step S1, cell row stripe write (case 1) is performed. Then, at step S2, for array block A(1) a dummy word line is turned on/off repeatedly. Subsequently, at step S2#, the array block A(1) data is read and whether the read data matches an expected value (write data: case 1) is determined. Then, at step S3, for array block A(2) a dummy word line is turned on/off repeatedly. Subsequently, at step S3#, the array block A(2) data is read and whether the read data matches an expected value is determined. Subsequently, for array blocks A(3) to A(N-1) successively one dummy word line is turned on/off repeatedly and the above decision is then made. At step S4, for array block A(N) a dummy word line is turned on/off repeatedly. Subsequently, at step S4#, the array block A(N) data is read and whether the read data matches an expected value is determined. Thus, half the memory cells are tested.

Then, at step S6, cell row stripe write (case 2) is performed.

Then, at step S7, for array block A(1) a dummy word line is turned on/off repeatedly. Subsequently, at step S7#, the array block A(1) data is read and whether the read data matches an expected value (write data: case 2) is determined. Then, at step S8, for array block A(2) a dummy word line is turned on/off repeatedly. Subsequently, at step S8#, the array block A(2) data is read and whether the read data matches an expected value is determined. Subsequently, for array blocks A(3) to A(N-1) successively one dummy word line is turned on/off repeatedly and the above decision is then made. At step S9, for array block A(N) a dummy word line is turned on/off repeatedly. Subsequently, at step S9#, the array block A(N) data is read and whether the read data matches an expected value is determined. Thus, the remaining half of the memory cells are tested.

Thus in the first embodiment if a semiconductor memory device has a flexible redundancy configuration the end page read refresh ensures that a channel leak is detected.

Second Embodiment

A second embodiment provides a semiconductor memory device as will now be described. A region provided with an array block (referred to as an array block formation region) has an outermost periphery at which there is provided a dummy formation region provided with a dummy cell, a dummy interconnection and the like, which are not responsible for circuit operation.

Figure 6:
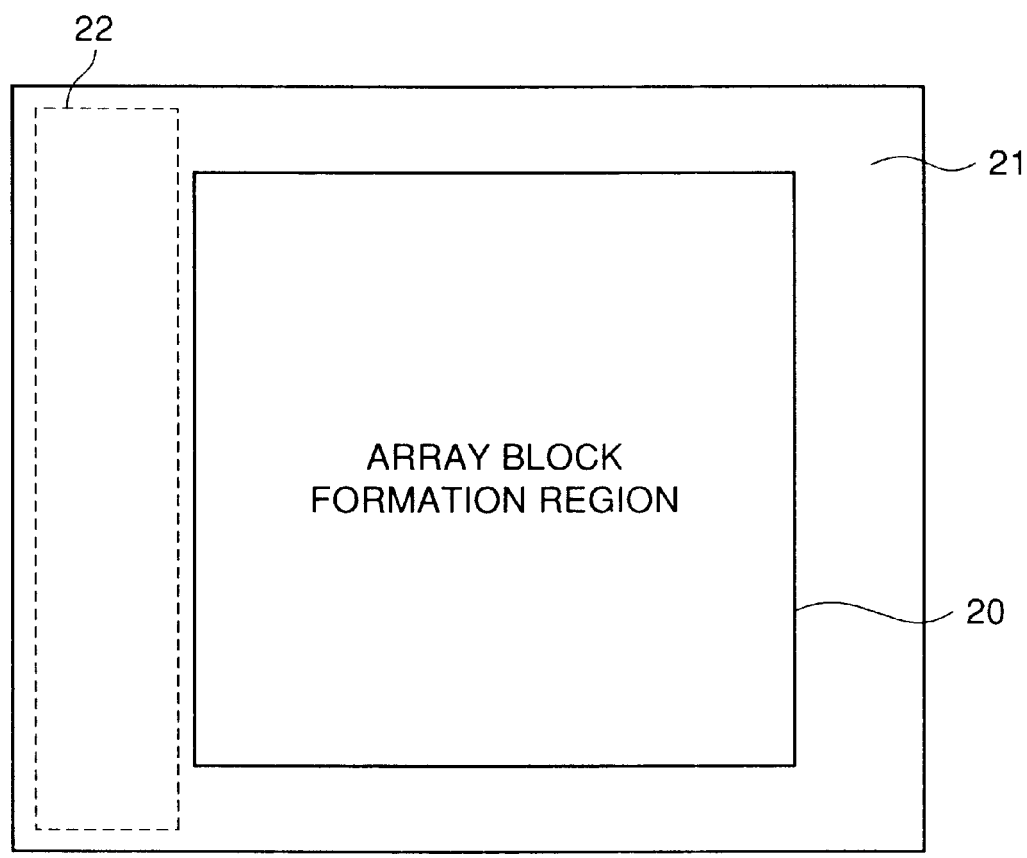
FIG. 6 illustrates a dummy word line formation region in a second embodiment of the present invention.

As shown in FIG. 6, a reference numeral 20 denotes an array block formation region provided with a memory cell and a word line, and a reference numeral 21 denotes a dummy formation region corresponding to an outermost periphery of array block formation region 20.

The second embodiment corresponds to the semiconductor memory device of the first embodiment with transistors 1a, 1b and dummy word lines DWL0, DWL1 formed in a dummy formation region 21 at a region 22. Thus the semiconductor memory device of the first embodiment can have a reduced layout area.

Third Embodiment

Figure 7:
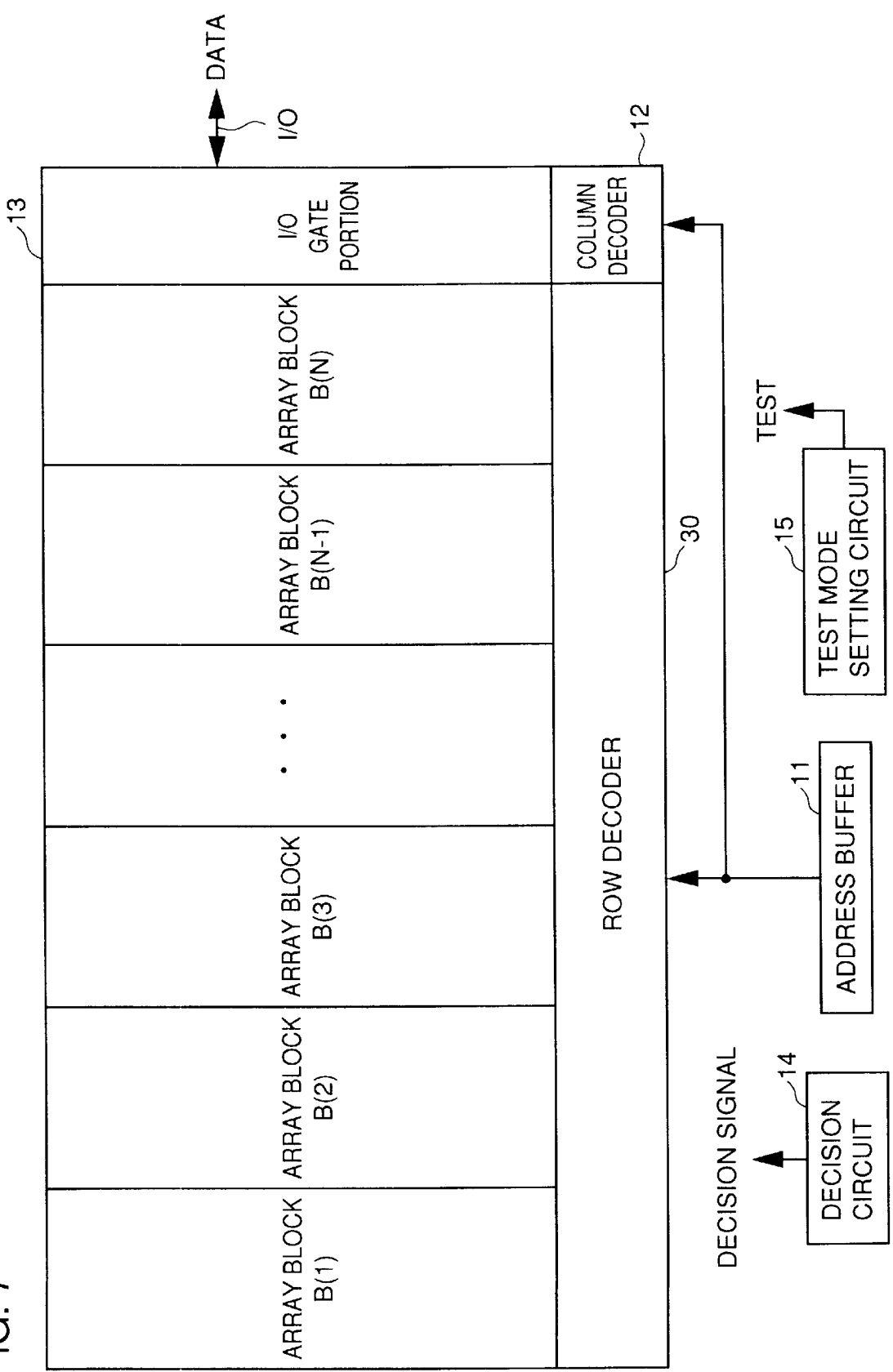
FIG. 7 is a block diagram generally showing a configuration of a semiconductor memory device in a third embodiment of the present invention.

A third embodiment provides a semiconductor memory device, as will now be described with reference to FIGS. 7 and 8. The present semiconductor memory device, as shown in FIG. 7, includes array blocks B(1)–B(N).

Figure 8:
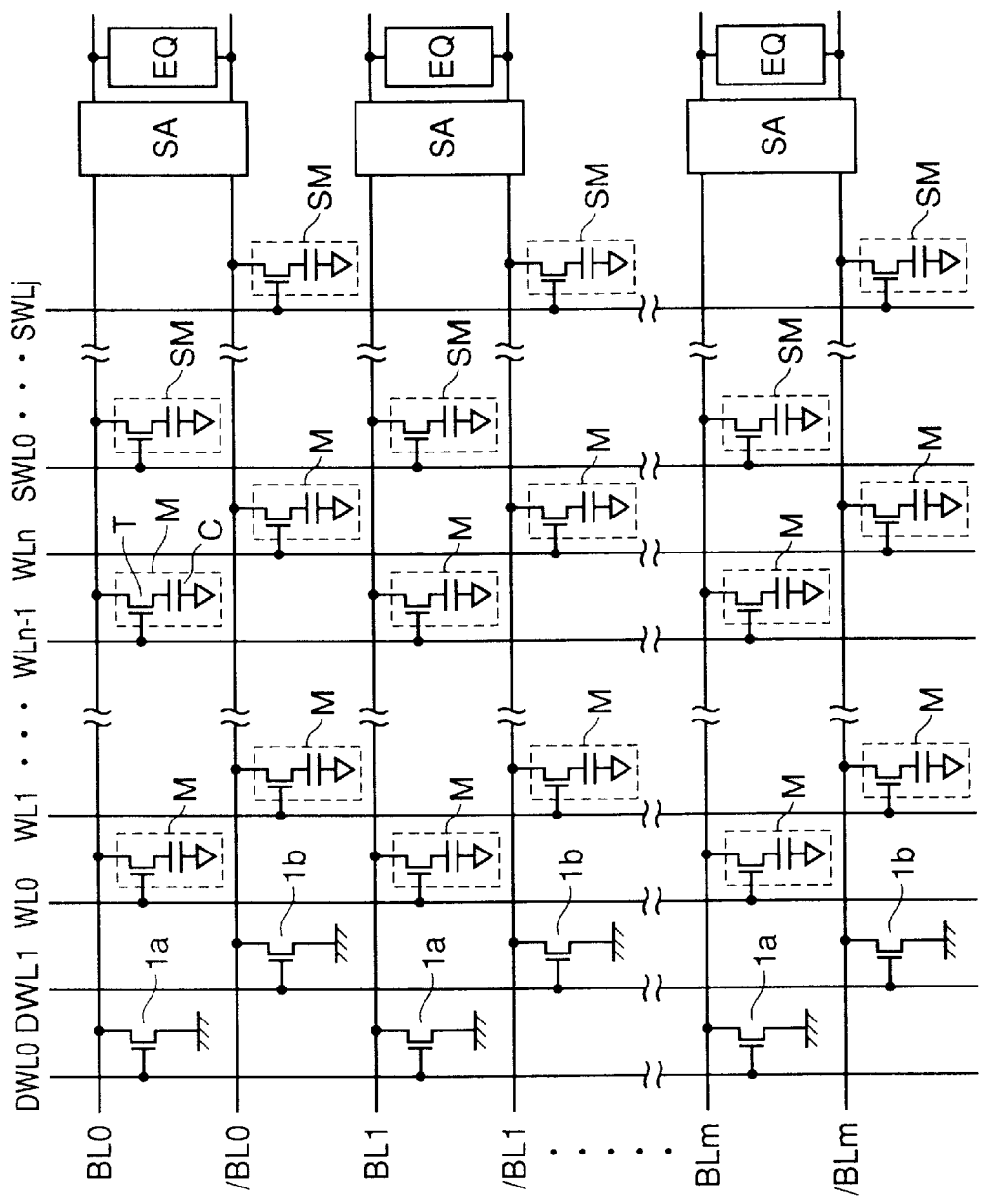
FIG. 8 illustrates a configuration of an array block in the third embodiment.

Array blocks B(1)–B(N) each include a normal word line and a spare word line, as shown in FIG. 8. In the figure, a reference character M a 20 denotes a normal memory cell, reference characters WL0–WLn denote normal word lines, reference characters BL0 and /BL0, BL1 and /BL1, . . . , BLm and /BLm denote bit lines, a reference character SM denotes a spare memory cell, and reference characters SWL0–SWLj denote spare word lines.

Of the normal word lines a defective word line is substituted with a spare word line existing in the same array block.

Array blocks B(1) to B(N) each also include a transistor 1a arranged for a bit line BLi, wherein i=0, . . . , m, a transistor 1b arranged for a bit line /BLi, wherein i=0, . . . , m, and dummy word lines DWL0, DWL1 arranged in the direction of the rows.

Transistors 1a, 1b each have one conduction terminal connected to a ground voltage GND and the other conduction terminal connected to a corresponding bit line, and the gate connected to a corresponding dummy word line.

The present semiconductor memory device generally operates, as will now be described with reference to FIGS. 7 and 8. In the normal mode of operation a row decoder 30 provides a row select operation according to an internal address output from address buffer 11. If in this operation decision circuit 14 has made a decision to use a spare then row decoder 30 does not operate to select a defective word line but a spare word line provided in the same array block.

In the end page read refresh, a test mode setting circuit 15 outputs a test signal TEST. In response to test signal TEST, row decoder 30 selects a dummy word line. When transistor 1a or 1b connected to the selected dummy word line is turned on, a bit line to which transistor 1a or 1b is connected is driven to ground potential GND.

The end page read refresh is performed according to the procedure of that provided in the first embodiment. In each array block a dummy word line is turned onloff to allow a bit line to have an amplitude, which applies stress on a memory cell.

Thus if a semiconductor memory device has a redundancy configuration other than a flexible redundancy configuration a testing configuration similar to that of the first embodiment can be applied thereto to detect a channel leak.

Fourth Embodiment

A fourth embodiment provides a semiconductor memory device as will now be described. A region provided with an array block (referred to as an array block formation region) has an outermost periphery at which there is provided a dummy formation region provided with a dummy cell, a dummy interconnection and the like, which are not responsible for circuit operation.

Figure 9:
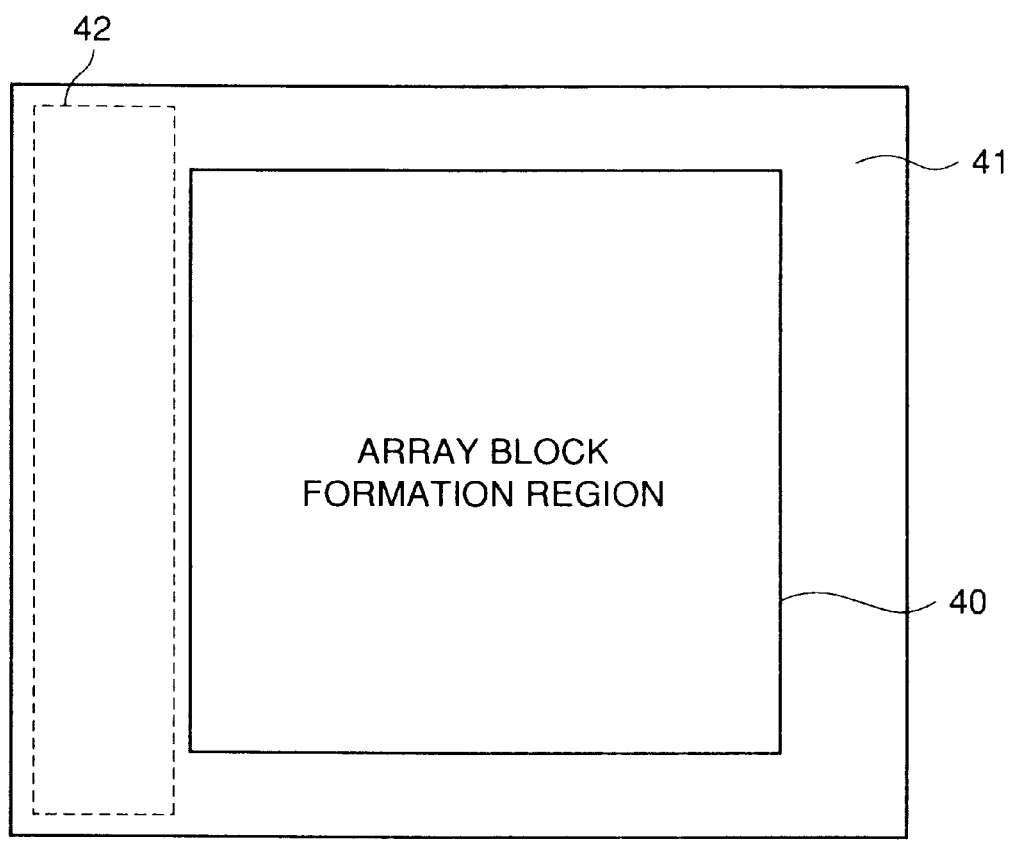
FIG. 9 illustrates a dummy word line formation region in a fourth embodiment of the present invention.

As shown in FIG. 9, a reference numeral 40 denotes an array block formation region provided with a memory cell and a word line, and a reference numeral 41 denotes a dummy formation region corresponding to an outermost periphery of array block formation region 40.

The fourth embodiment corresponds to the semiconductor memory device of the third embodiment with transistors 1a, 1b and dummy word lines DWL0, DWL1 formed in a dummy formation region 41 at a region 42. Thus the semiconductor memory device of the third embodiment can have a reduced layout area.

Fifth Embodiment

A fifth embodiment exemplarily provides an improvement of the semiconductor memory device provided in the first embodiment. The present embodiment provides array blocks A(1) to A(N−1) similar in configuration to those provided in the first embodiment, except that array block A(N), including a spare word line, does not include dummy word lines DWL0, DWL1 or transistors 1a, 1b.

Figure 10:
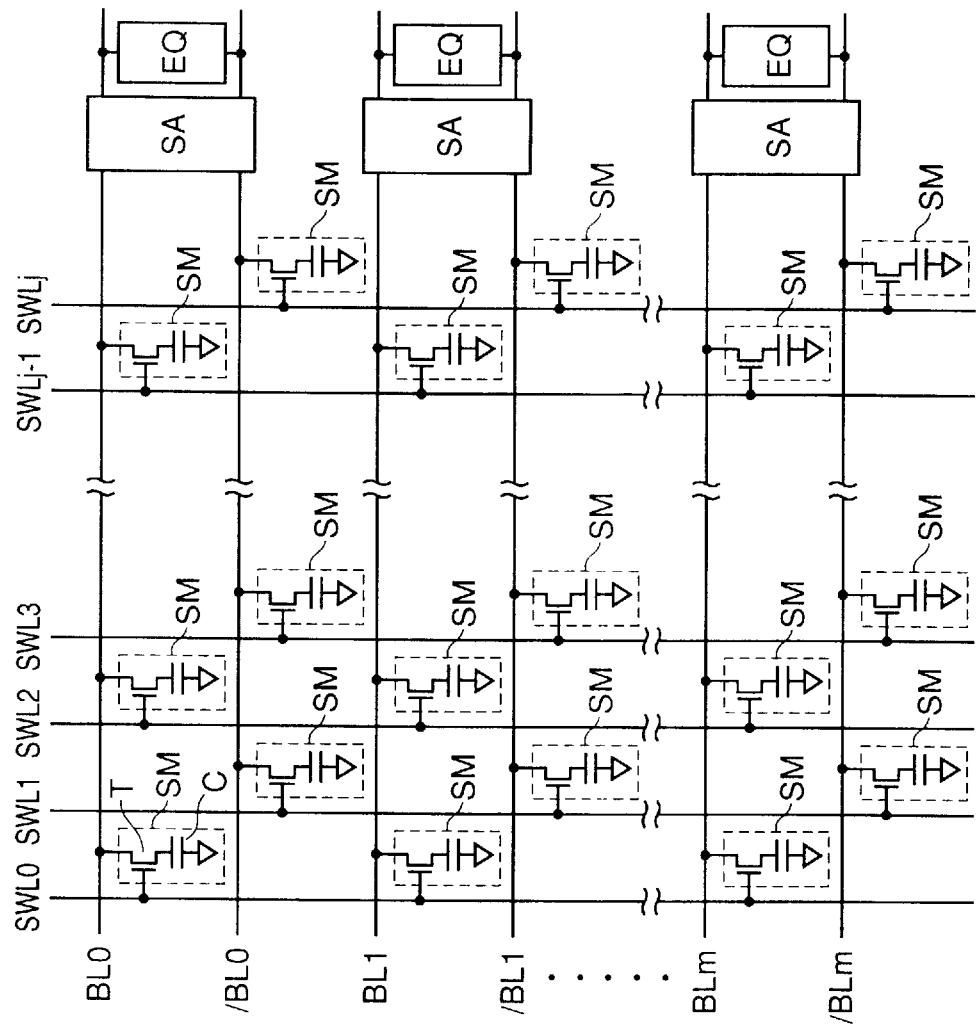
FIG. 10 illustrates a configuration of an array block including a spare word line in a fifth embodiment of the present invention.

As shown in FIG. 10, array block A(N) is configured of spare word line SWL0–SWLj, a spare memory cell SM, and bit lines BL0 and /BL0, BL1 and /BL1, . . . , and BLm and /BLm. Thus array block A(N) can have a reduced area.

It should be noted that in array block A(N) a spare word line is not substituted by a word line. As such, the end page read refresh can be conducted simply by repeatedly turning on/off any one of spare word lines.

Sixth Embodiment

A sixth embodiment provides a semiconductor memory device, as will now be described with reference to FIGS. 11–13. The present semiconductor memory device includes array blocks C(1) to C(N−1) including a normal word line and an array block C(N) including a spare word line provided to substitute for a defective word line.

Figure 11:
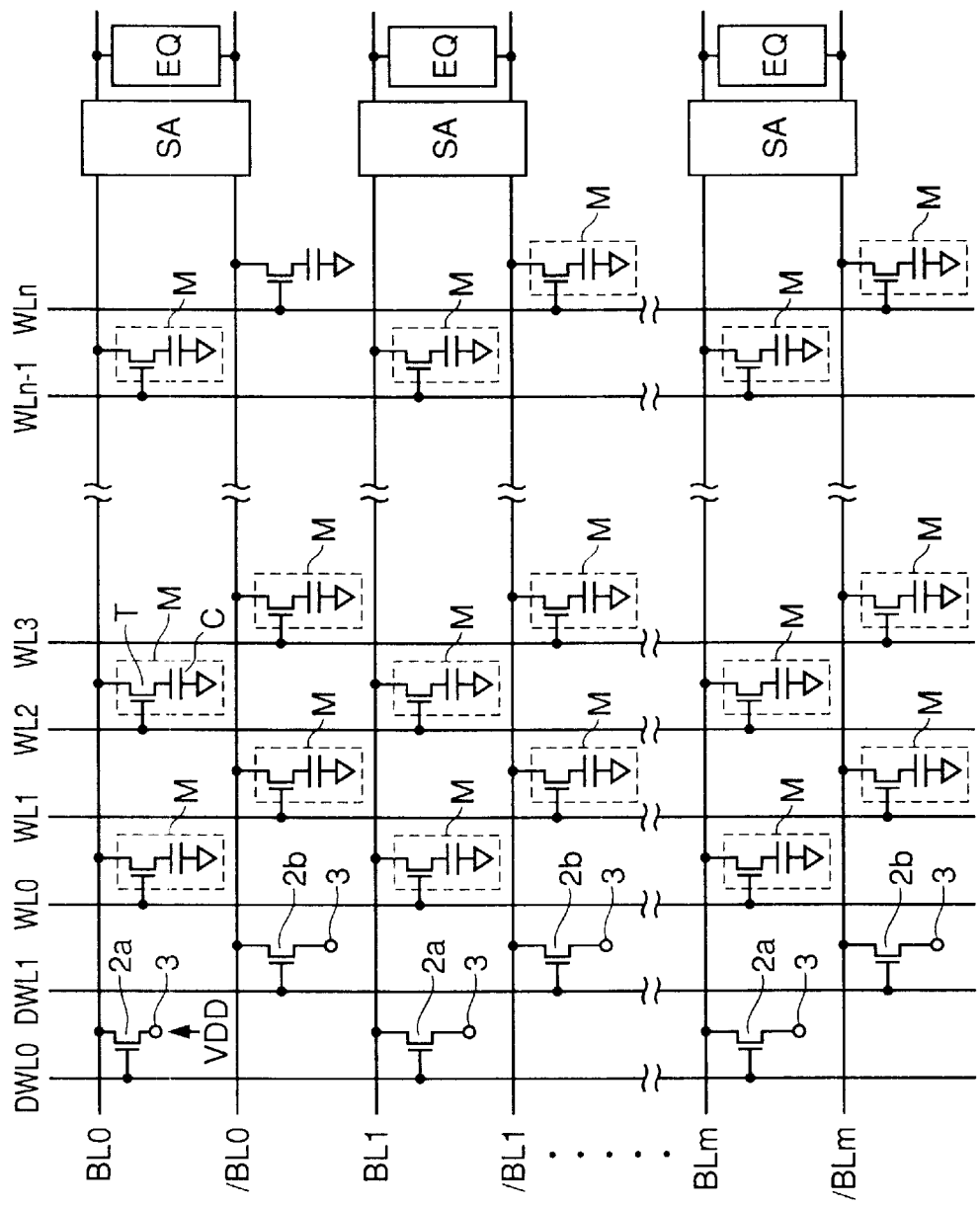
FIG. 11 illustrates a configuration of an array block including a normal word line in a sixth embodiment of the present invention.

Array blocks C(1) to C(N−1), as shown in FIG. 11, each include a plurality of normal memory cells Ms arranged in rows and columns, normal word lines WL1–WLn arranged in the direction of the rows, and bit lines BL0 and /BL0, BL1 and /BL1, . . . , BLm and /BLm arranged in the direction of the columns.

Airay blocks C(1) to C(N−1) each also include a transistor 2a arranged for a bit line BLi, wherein i=0, . . . , m, a transistor 2b arranged for a bit line /BLi, wherein i=0, . . . , m, and dummy word lines DWL0, DWL1 arranged in the direction of the rows.

Transistors 2a and 2b each have one conduction terminal connected to a node 3 and the other conduction terminal connected to a corresponding bit line, and the gate connected to a corresponding dummy word line. Node 3 receives voltage. In the figure, node 3 receives a power supply voltage VDD.

Figure 12:
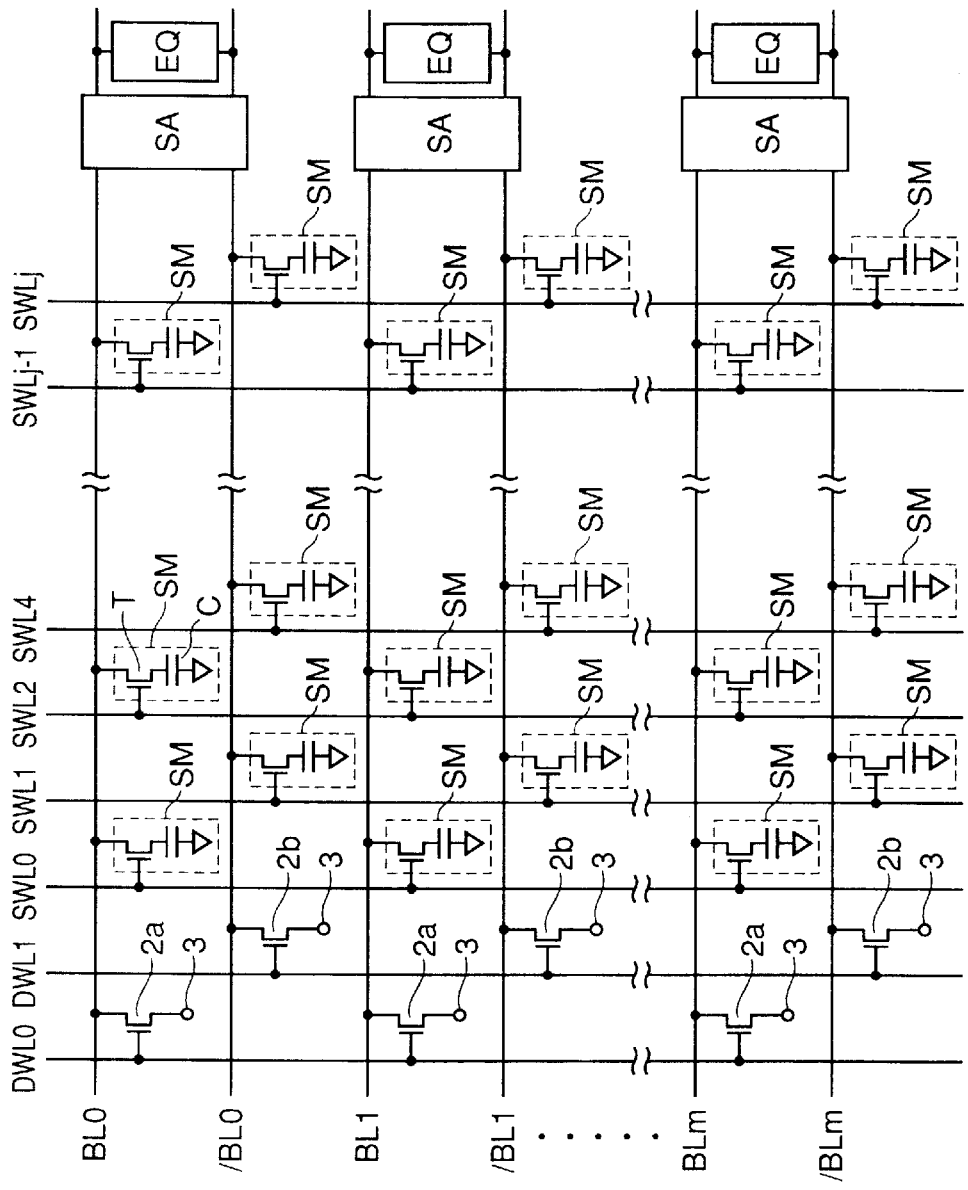
FIG. 12 illustrates a configuration of an array block including a spare word line in the sixth embodiment.
Figure 13:
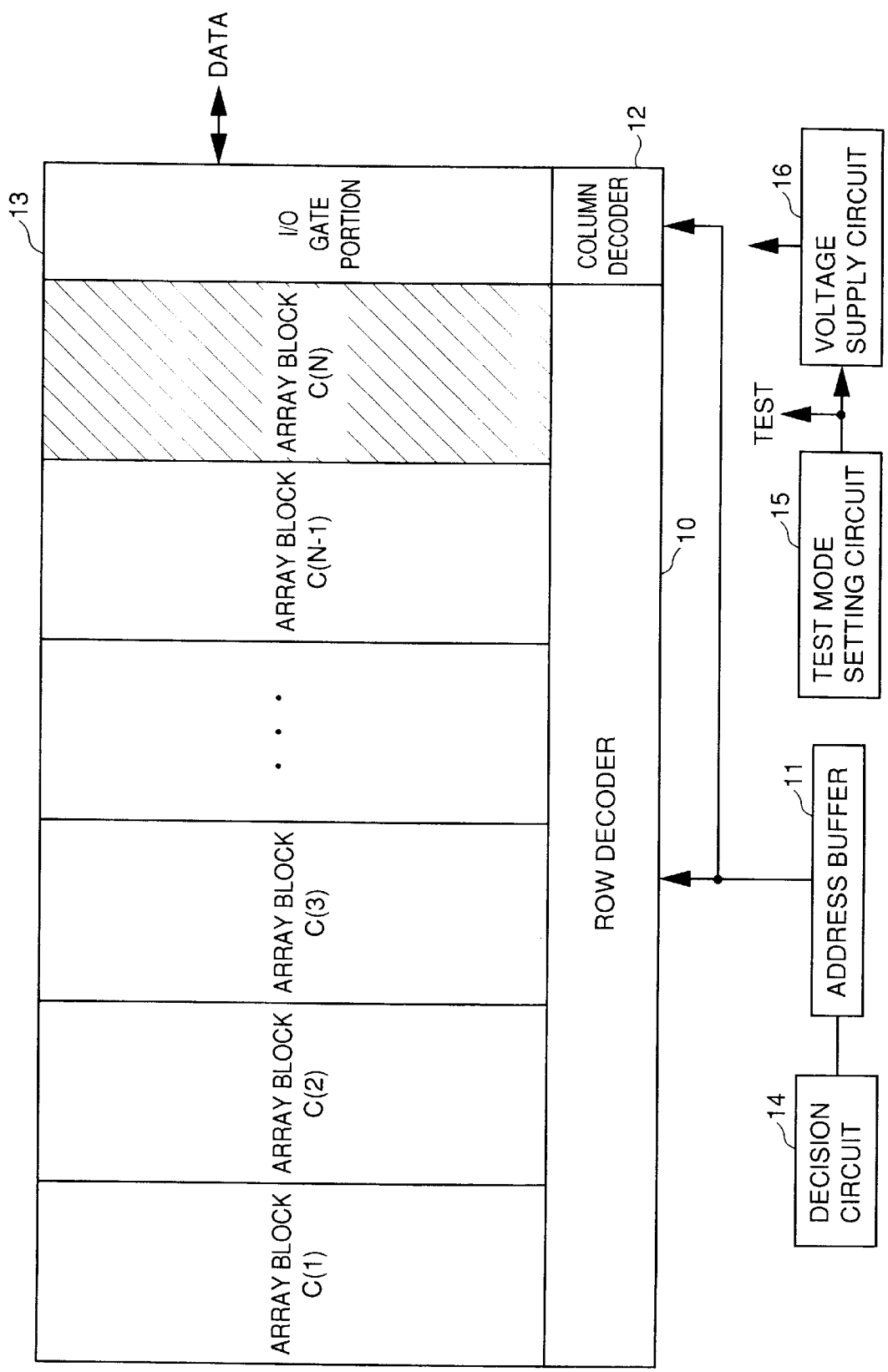
FIG. 13 is a block diagram generally showing a configuration of a semiconductor memory device in the sixth embodiment.

Array block C(N), as shown in FIG. 12, includes a plurality of spare memory cells SMs arranged in rows and columns, spare word lines SWL1–SWLj arranged in the direction of the rows, and bit lines BL0 and /BL0, BL1 and /BL1, . . . , and BLm and /BLm arranged in the direction of the columns.

Array block C(N) also includes transistor 2a arranged for bit line BLi, 10 wherein i=0, . . . , m, transistor 2b arranged for bit line IBLi, wherein i=0, . . . , m, and dummy word line DWL0, DWL1 arranged in the direction of the rows.

In array block C(N), as well as array blocks C(1) to C(N−1), transistors 2a and 2b each have one conduction terminal connected to node 3 and the other conduction terminal connected to a corresponding bit line, and the gate connected to a corresponding dummy word line.

The present semiconductor memory device generally operates, as will now be described with reference to FIGS. 11 and 13. In the normal mode of operation a row decoder 10 provides a row select operation according to an internal address output from address buffer 11. If in this operation decision circuit 14 has made a decision to use a spare then rather than a normal word line a spare word line is selected in array block C(N).

The end page read refresh proceeds as has been described in the first embodiment. In the end page read refresh, a test mode setting circuit 15 outputs a test signal TEST. In response to test signal TEST, row decoder 10 selects a dummy word line. When transistor 2a or 2b connected to the selected dummy word line is turned on, a bit line to which the transistor is connected is set to power supply voltage VDD.

Memory cells have previously written therein high level data slightly higher in level than power supply voltage VDD and low level data slightly lower in level than power supply voltage VDD.

Turning on/off transistor 2a or 2b applies stress on a memory cell connected to the same bit line as the transistor and having data of logical low written therein.

Node 3 may receive a fixed level of voltage or variable voltage. If node 3 receives variable voltage, then for example externally or from the FIG. 13 voltage supply circuit 16 node 3 receives a level of voltage provided based on a potential of data stored in a memory cell and suitable for detecting a channel leak.

Thus in the sixth embodiment if a semiconductor memory device has a flexible redundancy configuration the end page read refresh ensures that a channel leak is detected.

Seventh Embodiment

A seventh embodiment provides a semiconductor memory device as will now be described. As has been described in the second embodiment, a region provided with an array block (referred to as an array block formation region) has an outermost periphery at which there is provided a dummy formation region provided with a dummy cell, a dummy interconnection and the like, which are not responsible for circuit operation.

The seventh embodiment corresponds to the semiconductor memory device of the sixth embodiment with transistors 2a, 2b and dummy word lines DWL0, DWL1 formed in the FIG. 6 dummy formation region 21 at a region 22. Thus the semiconductor memory device of the sixth embodiment can have a reduced layout area.

Eighth Embodiment

Figure 14:
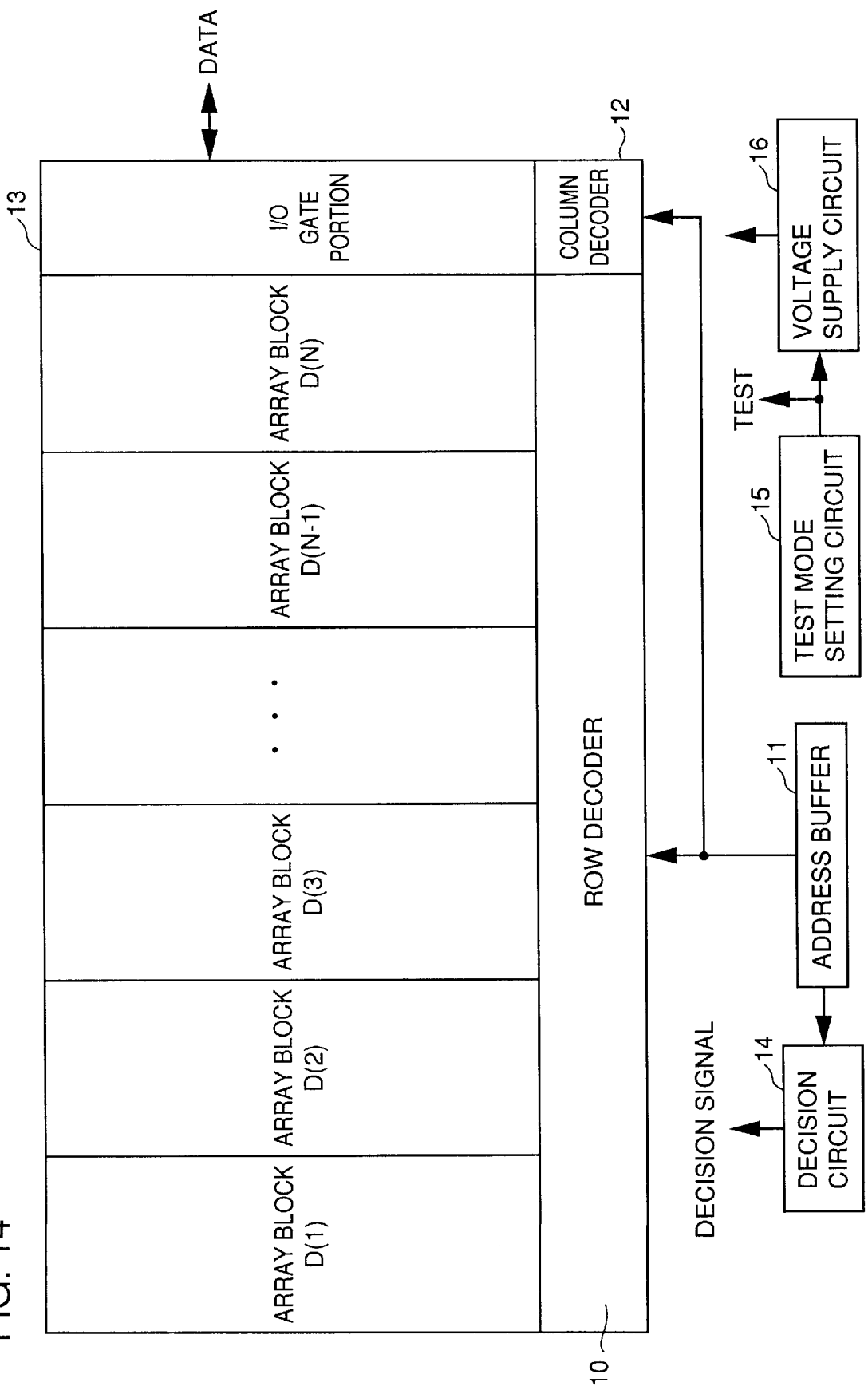
FIG. 14 is a block diagram generally showing a configuration of a semiconductor memory device in an eighth embodiment of the present invention.

An eighth embodiment provides a semiconductor memory device, as will now be described with reference to FIGS. 14 and 15. The present semiconductor memory device, as shown in FIG. 14, includes array blocks D(1)–D(N).

Figure 15:
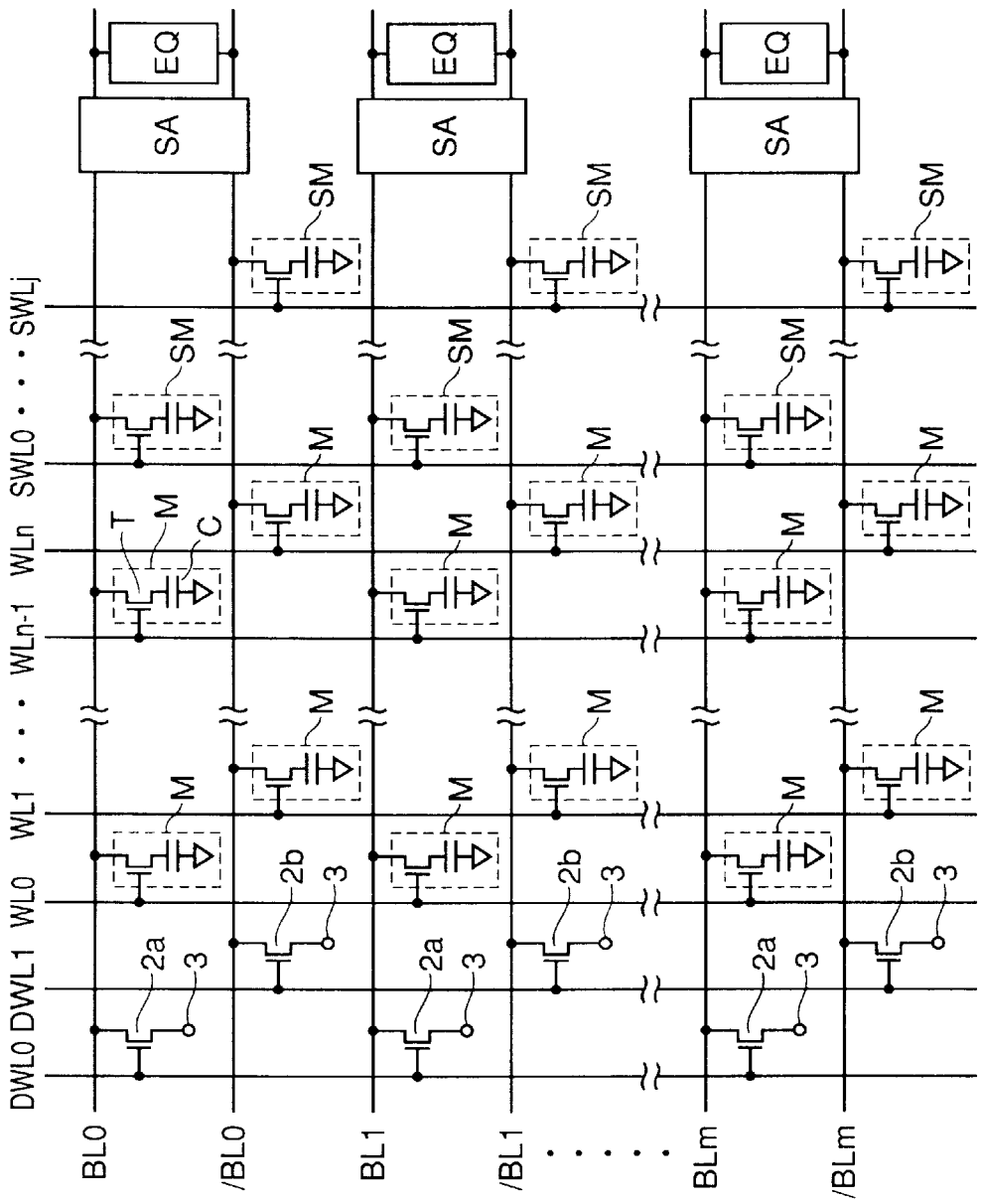
FIG. 15 illustrates a configuration of an array block in the eighth embodiment.

Array blocks D(1)–D(N) each include a normal word line and a spare word line, as shown in FIG. 15. In the figure, a reference character M denotes a normal memory cell, reference characters WL0–WLn denote normal word lines, reference characters BL0 and /BL0, BL1 and /BL1, . . . , BLm and /BLm denote bit lines, a reference character SM denotes a spare memory cell, and reference characters SWL0–SWLj denote spare word lines.

Of the normal word lines a defective word line is substituted with a spare word line existing in the same array block.

Array blocks D(1) to D(N) each also include a transistor 2a arranged for a bit line BLi, wherein i=0, . . . , m, a transistor 2b arranged for a bit line /BLi, wherein i=0, . . . , m, and dummy word lines DWL0, DWL1 arranged in the direction of the rows.

Transistors 2a and 2b each have one conduction terminal connected to a node 3 and the other conduction terminal connected to a corresponding bit line, and the gate connected to a corresponding dummy word line. Node 3 receives voltage. In the figure, node 3 receives a power supply voltage VDD.

The present semiconductor memory device generally operates, as will now be described with reference to FIGS. 14 and 15. In the normal mode of operation a row decoder 10 provides a row select operation according to an internal address output from address buffer 11. If in this operation decision circuit 14 has made a decision to use a spare then rather than a normal word line a spare word line is selected in the same array block.

In the end page read refresh, a test mode setting circuit 15 outputs a test signal TEST. In response to test signal TEST, row decoder 10 selects a dummy word line. When transistor 2a or 2b connected to the selected dummy word line is turned on, a bit line to which the transistor is connected is driven to power supply voltage VDD.

The end page read refresh proceeds as has been described above. Memory cells have previously written therein high level data slightly higher in level than power supply voltage VDD and low level data slightly lower in level than power supply voltage VDD.

Turning on/off transistor 2a or 2b applies stress on a memory cell connected to the same bit line as the transistor and having data of logical low written therein.

Node 3 may receive a fixed level of voltage or variable voltage. If node 3 receives variable voltage, then for example externally or from the FIG. 14 voltage supply circuit 16 node 3 receives a level of voltage provided based on a potential of data stored in a memory cell and suitable for detecting a channel leak.

Thus in the eighth embodiment if a semiconductor memory device has a redundancy configuration other than a flexible redundancy configuration a testing configuration similar to that provided in the sixth embodiment can be applied thereto to detect a channel leak.

Ninth Embodiment

A ninth embodiment provides a semiconductor memory device as will now be described. As has been described in the fourth embodiment, a region provided with an array block (referred to as an array block formation region) has an outermost periphery at which there is provided a dummy formation region provided with a dummy cell, a dummy interconnection and the like, which are not responsible for circuit operation.

The ninth embodiment corresponds to the semiconductor memory device of the eighth embodiment with transistors 2a, 2b and dummy word lines DWL0, DWL1 formed in the FIG. 9 dummy formation region 41 at a region 42. Thus the semiconductor memory device of the eighth embodiment can have a reduced layout area.

Tenth Embodiment

A tenth embodiment exemplarily provides an improvement of the semiconductor memory device provided in the sixth embodiment. The present embodiment provides array blocks C(1) to C(N−1) similar in configuration to those provided in the sixth embodiment, except that array block C(N), including a spare word line, does not include dummy word lines DWL0, DWL1 or transistors 2a, 2b.

Figure 16:
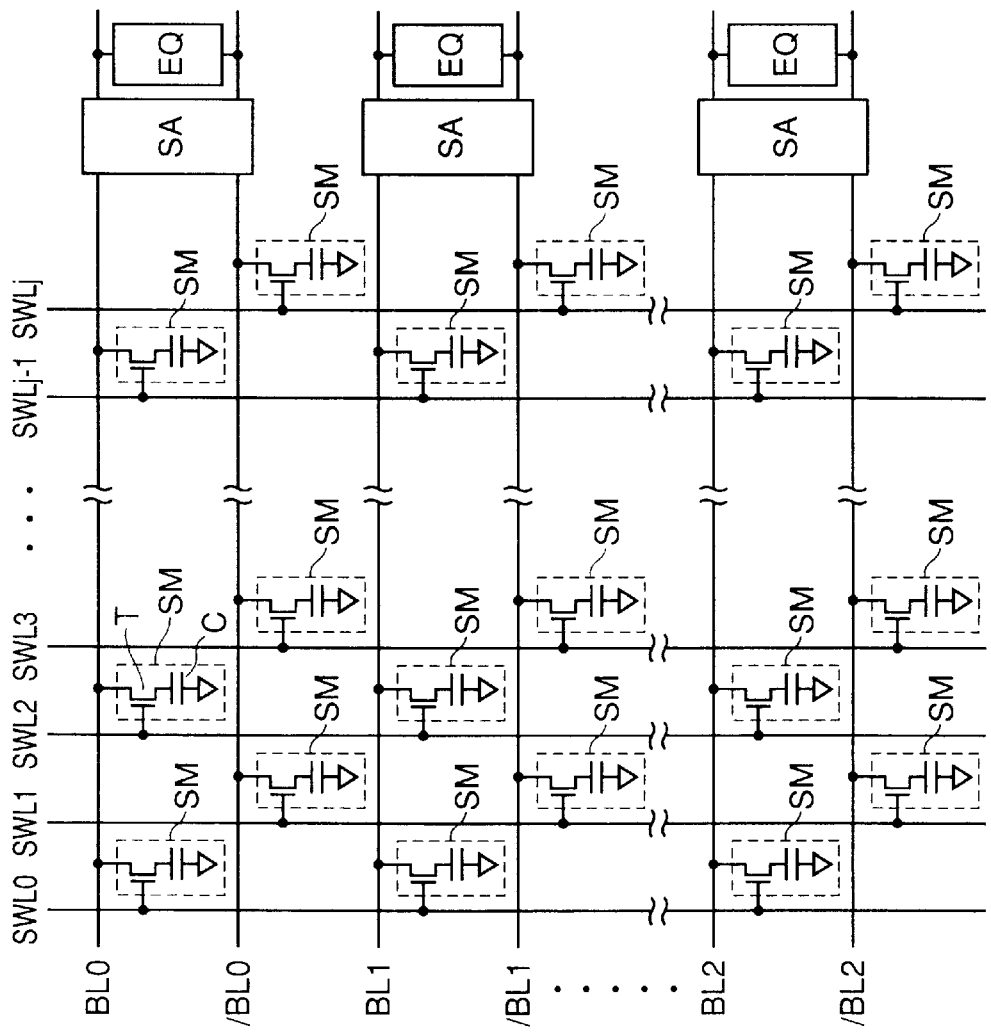
FIG. 16 illustrates a configuration of an array block including a spare word line in a tenth embodiment of the present invention.

As shown in FIG. 16, array block C(N) is configured of spare word line SWL0–SWLj, a spare memory cell SM, and bit lines BL0 and /BL0, BL1 and /BL1, . . . , and BLm and /BLm. Thus array block C(N) can have a reduced area.

It should be noted that in array block C(N) a spare word line is not substituted by a word line. As such, the end pate read refresh can be conducted simply by repeatedly turning on/off any one of spare word lines.

11th Embodiment

An 11th embodiment shows a testing configuration in a semiconductor memory device having a flexible redundancy configuration.

An array block including a normal word line is labeled A(1)–A(N−1) nd an array block including a spare word line is labeled A(N). A defective ord line in array blocks A(1) to A(N−1) is substituted by a spare word line ncluded in array block A(N).

Furthermore, array blocks A(1)–A(N) each include dummy word lines DWL0, DWL1. To the dummy word lines is connected a transistor (1a or 1b, or 2a or 2b) driving a bit line's potential, as has been described in the first or sixth embodiment.

Figure 17:
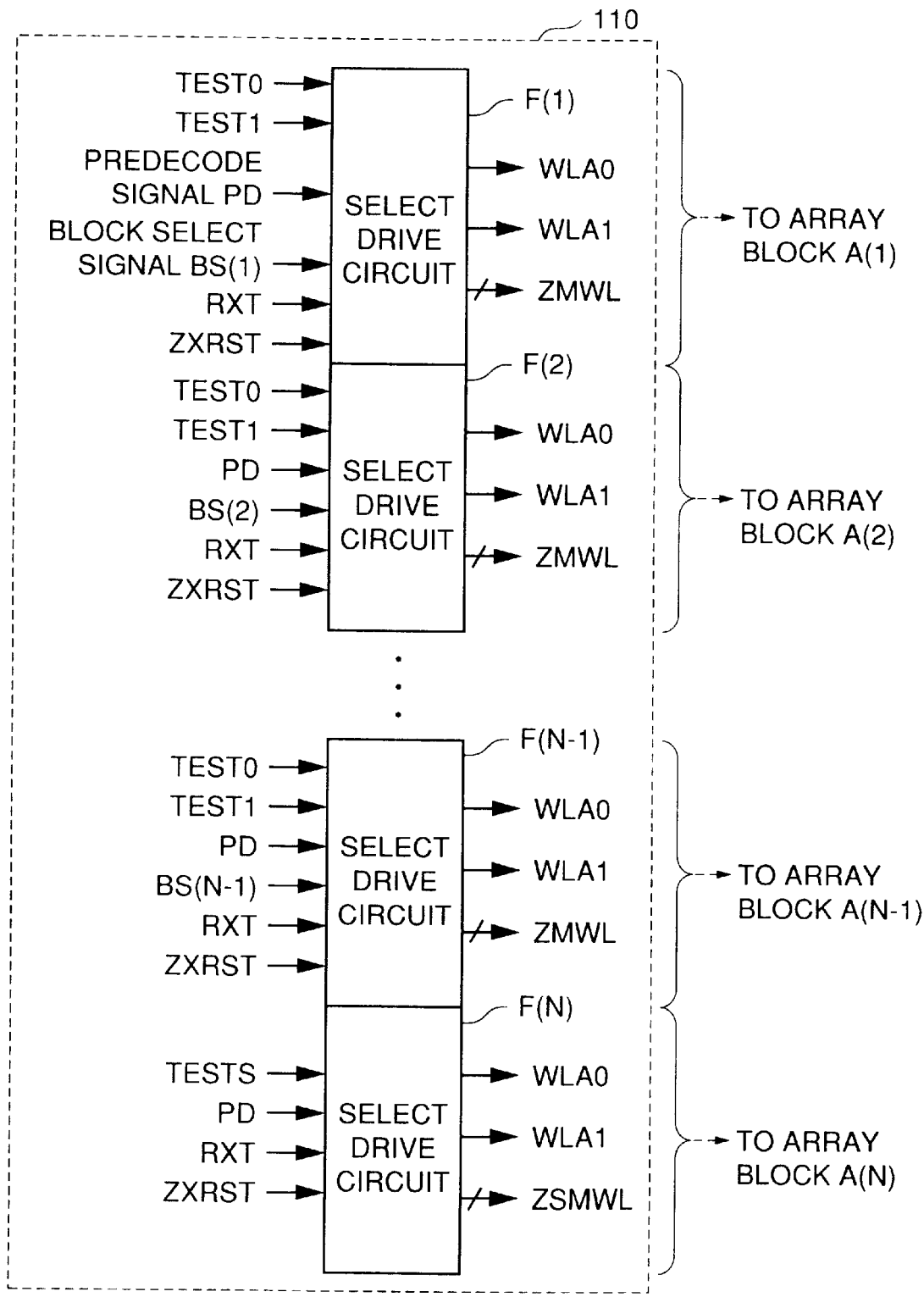
FIG. 17 is a block diagram showing a configuration of a select drive unit 110 in an 11th embodiment of the present invention.

In the 11th embodiment a semiconductor memory device 1100 includes a row-related select drive circuit as will be described hereinafter. As shown in FIG. 17, semiconductor memory device 1100 is provided with a select drive unit 110 including select drive circuits F(1)–F(N). Select drive circuits F(1) to F(N−1) are provided for array blocks A(1) to A(N−1), respectively, and select diive circuit F(N) is provided for array block A(N).

Select drive circuit F(i), wherein i=1 to (N−1), receives test signals TEST0 and TEST1 used in conducting the end page read refresh, a predecode signal PD designating a word line to be activated, a block select signal BS(i) designating an array block, a signal RXT designating a row select operation, and a reset signal ZXRST provided to reset a word line.

Select drive circuit F(i), wherein i=1 to (N−1), outputs a signal ZMWL provided to drive a normal word line of array block A(i), a signal WLA0 provided to drive dummy word line DWL0 of array block A(i), and a signal WLA1 provided to drive dummy word line DWL1 of array block A(i).

Select drive circuit F(N) receives a test signal TESTS activated in the end page read refresh when array block A(N) has been designated, a predecode signal PD designating a word line to be activated, a signal RXT designating a row select operation, and a reset signal ZXRST provided to reset a word line.

Select drive circuit F(N) outputs a signal ZSMWL provided to drive a spare word line of array block A(N), a signal WLA0 provided to drive dummy word line DWL0 of array block A(N), and a signal WLA1 provided to drive dummy word line DWL1 of array block A(N).

In the end page read refresh, depending on the dummy word line used one of test signals TEST0 and TEST1 goes high. In testing array block A(N) in particular, test signal TESTS goes high. In a mode other than the end page read refresh, test signals TEST0, TEST1, TESTS are held low.

Figure 18:
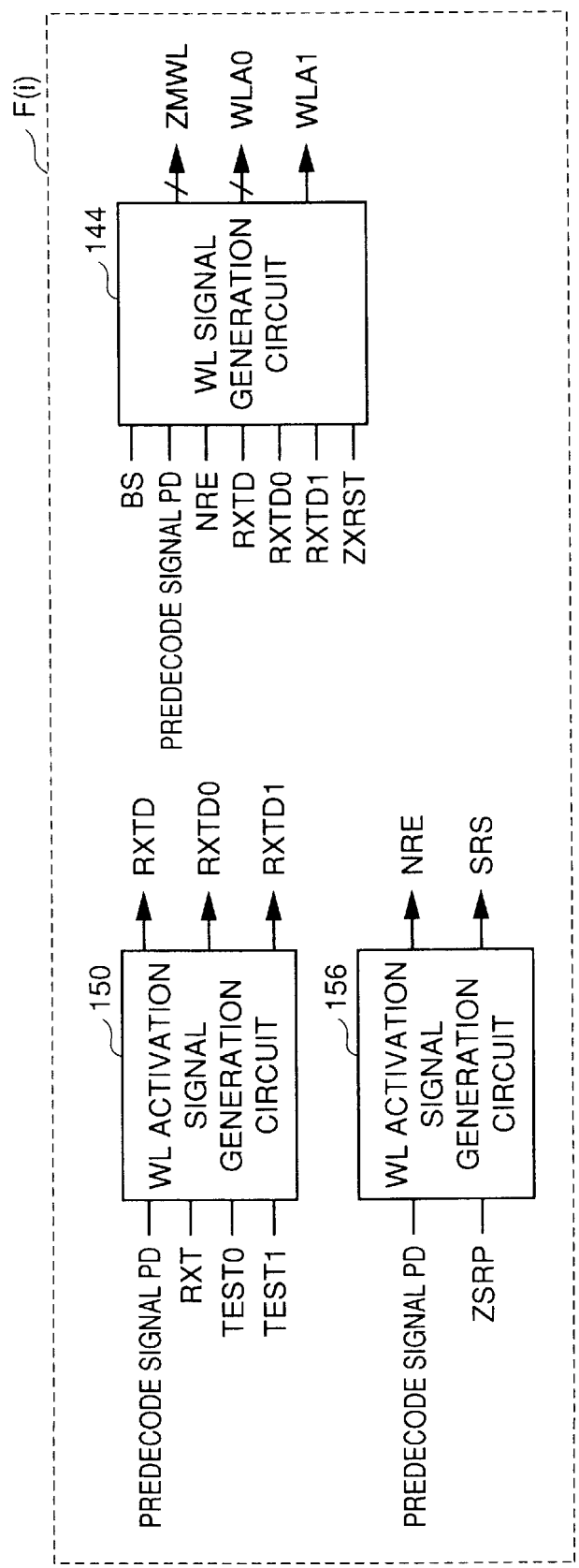
FIG. 18 is a block diagram showing a configuration of a select drive circuit F(i) in the 11th embodiment, wherein i=1 to (N-1)

With reference to FIG. 18, select drive circuit F(i), wherein i=1 to (N−1), include WL activation signal generation circuits 150 and 156 and a WL signal generation circuit 144.

WL activation signal generation circuit 150 receives predecode signal PD, signal RXT and test signals TEST0 and TEST1 and outputs signal RXTD relevant to activating a word line and signals RXTD0 and RXTD1 relevant to activating a dummy word line.

WL activation signal generation circuit 156 responds to predecode signal PD and reset signal ZSRP by outputting a signal NRE provided to select a normal word line and a signal SRS provided to select a spare word line.

WL signal generation circuit 144 responds to a corresponding block select signal BS, signal NRE, signals RXTD, RXTD0, RXTD1, predecode signal PD and reset signal ZXRST by outputting signals ZMWL, WAL0, WAL1. Block select signal BS represents block select signals BS(1), . . . .

Figure 19:
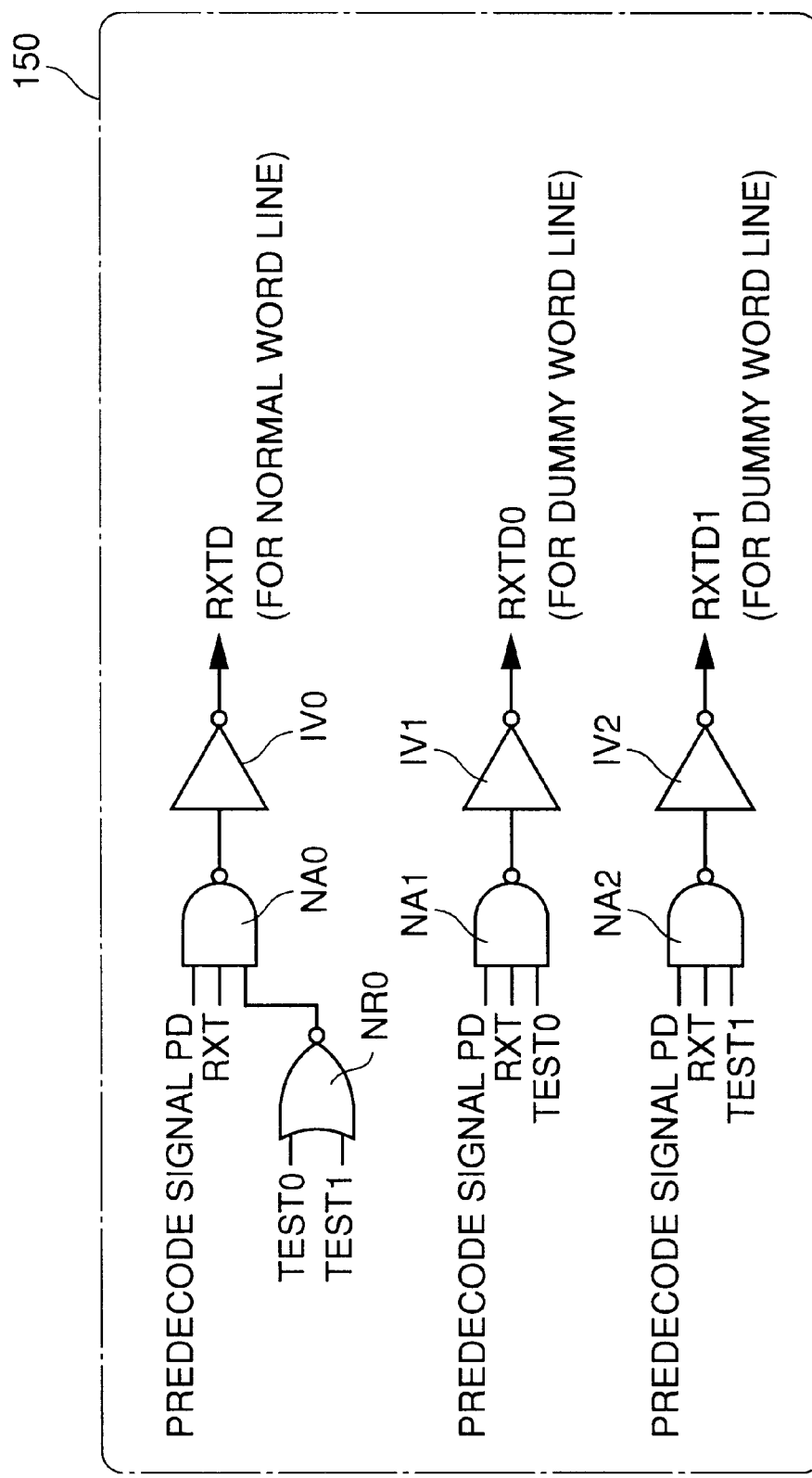
FIG. 19 shows a configuration of a WL activation signal generation circuit 150.

WL activation signal generation circuit 150, as shown in FIG. 19, includes an NOR circuit NRO, NAND circuits NAO-NA2, and inverters IV0–IV2. NOR circuit NR0 receives test signals TEST0 and TEST1. NAND circuit NA0 receives predecode signal PD, signal RXT, and an output from NOR circuit NR0. Inverter IV0 inverts an output received from NAND circuit NA0 and outputs signal RXTD provided for a normal word line.

NAND circuit NA1 receives predecode signal PD, signal RXT and test signal TEST0. Inverter IV1 inverts an output received fiom NAND circuit NA1 and outputs signal RXTD0 provided for a dummy word line.

NAND circuit NA2 receives predecode signal PD, signal RXT and test signal TEST1. Inverter IV2 inverts an output received from NAND circuit NA2 and outputs signal RXTD1 provided for a dummy word line.

Figure 20:
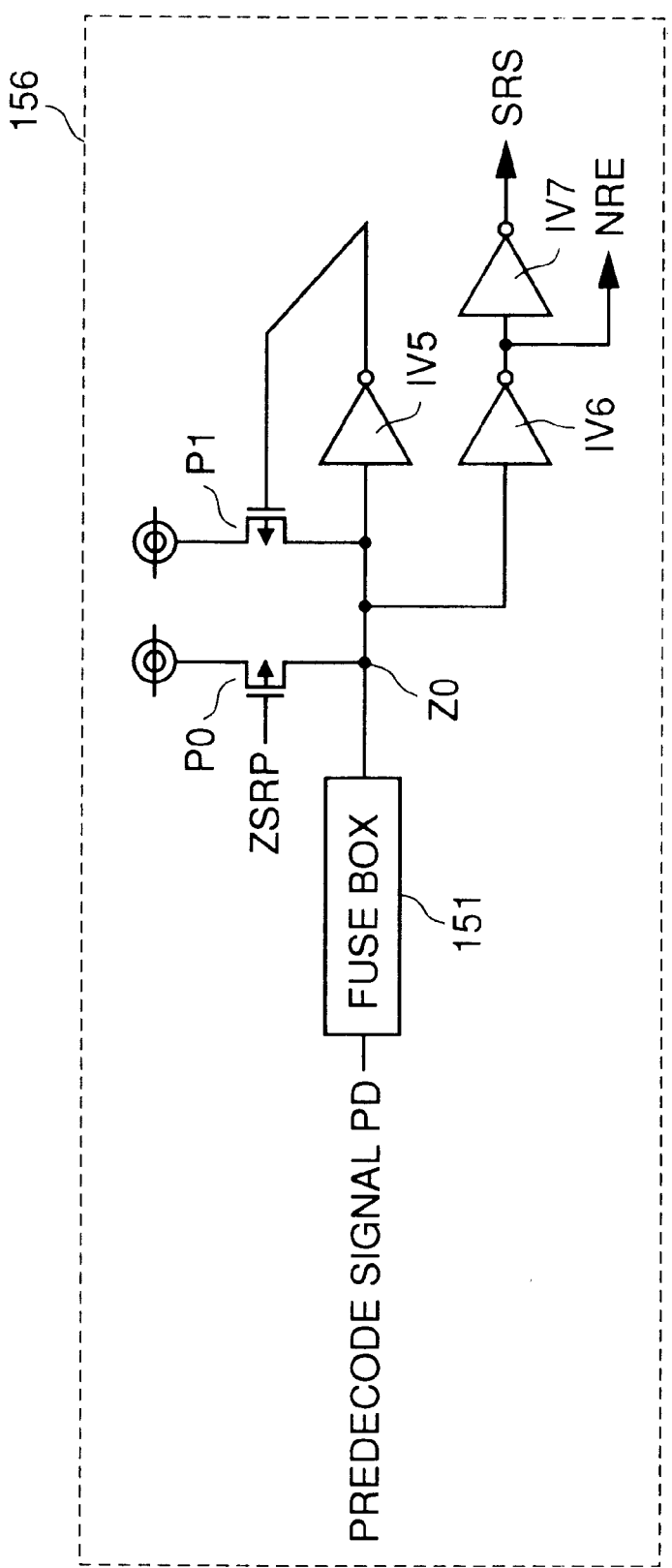
FIG. 20 shows a configuration of a WL activation signal generation circuit 156.

WL activation signal generation circuit 156, as shown in FIG. 20, includes a fuse box 151, transistors P0 and P1, and inverters IV5, IV6, IV7. Transistors P0, P1 are PMOS transistors.

Fuse box 151 includes a plurality of fuses, which are blown according to an address representing a defective word line. Fuse box 151 compares predecode signal PD input with a defective address previously programmed and refers to a result of the comparison to drive the node Z0 potential.

Transistors P0, P1 are each connected between a power supply voltage node and node Z0. Transistor P0 has its gate receiving reset signal ZSRP. Inverter IV5 inverts an output received from node Z0. The transistor P1 gate receives the inverter IV5 output.

When reset signal ZSRP is driven low, node Z0 attains the power supply voltage level, i.e., it is reset.

Inverter IV6 inverts an output received from node Z0 and outputs signal NRE. IV7 inverts signal NRE and outputs signal SRS.

Figure 21:
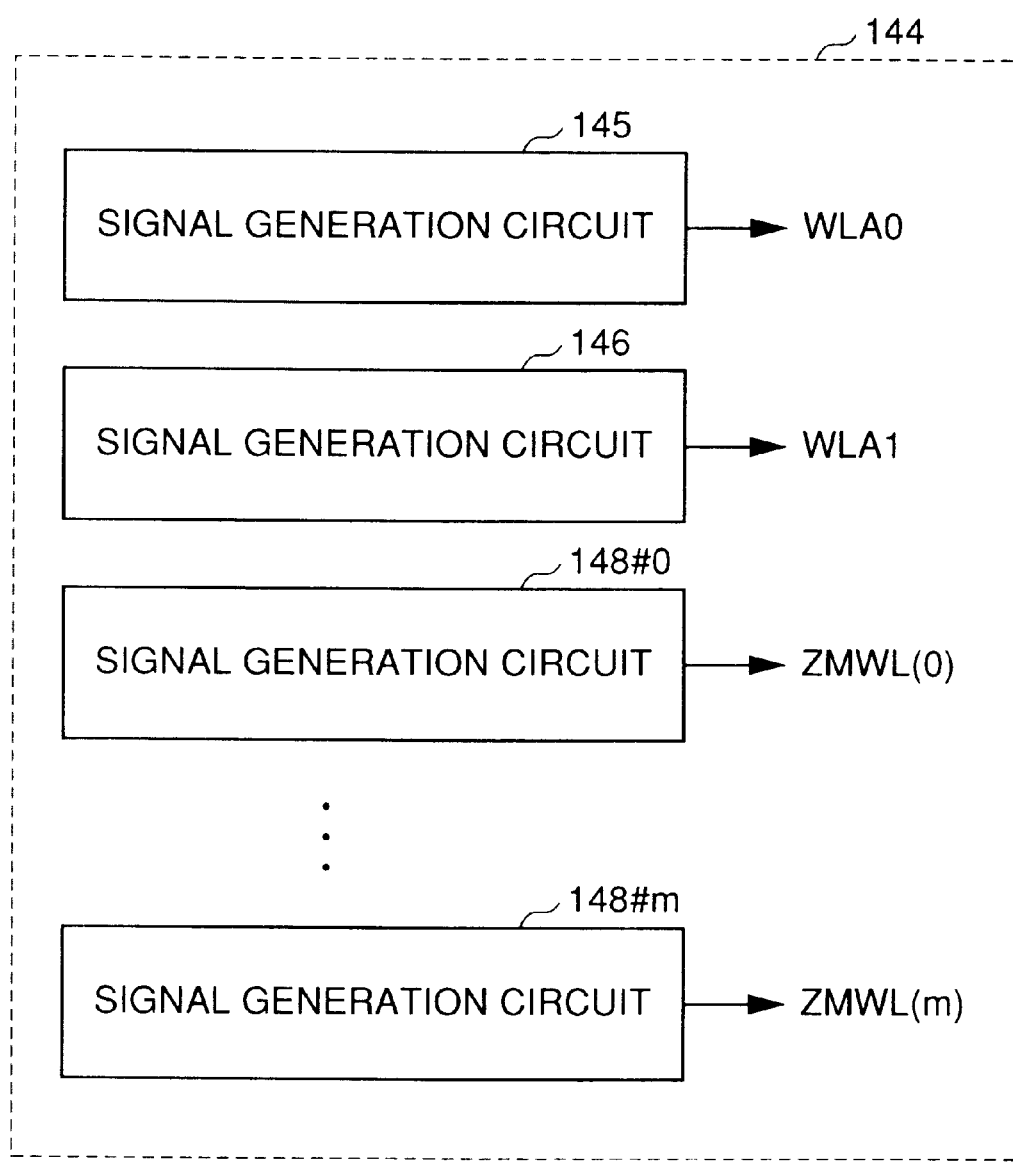
FIG. 21 shows a configuration of a WL signal generation circuit 144.

WL signal generation circuit 144, as shown in FIG. 21, includes a signal generation circuit 145 provided for dummy word line DWL0 and a signal generation circuit 146 provided for dummy word line DWL1.

WL signal generation circuit 144 also includes a plurality of signal generation circuits provided for their respective normal word lines. In the figure, signal generation circuits 148#0, 148#m are representatively shown, provided for normal word line WL0, WLm.

Figure 22:
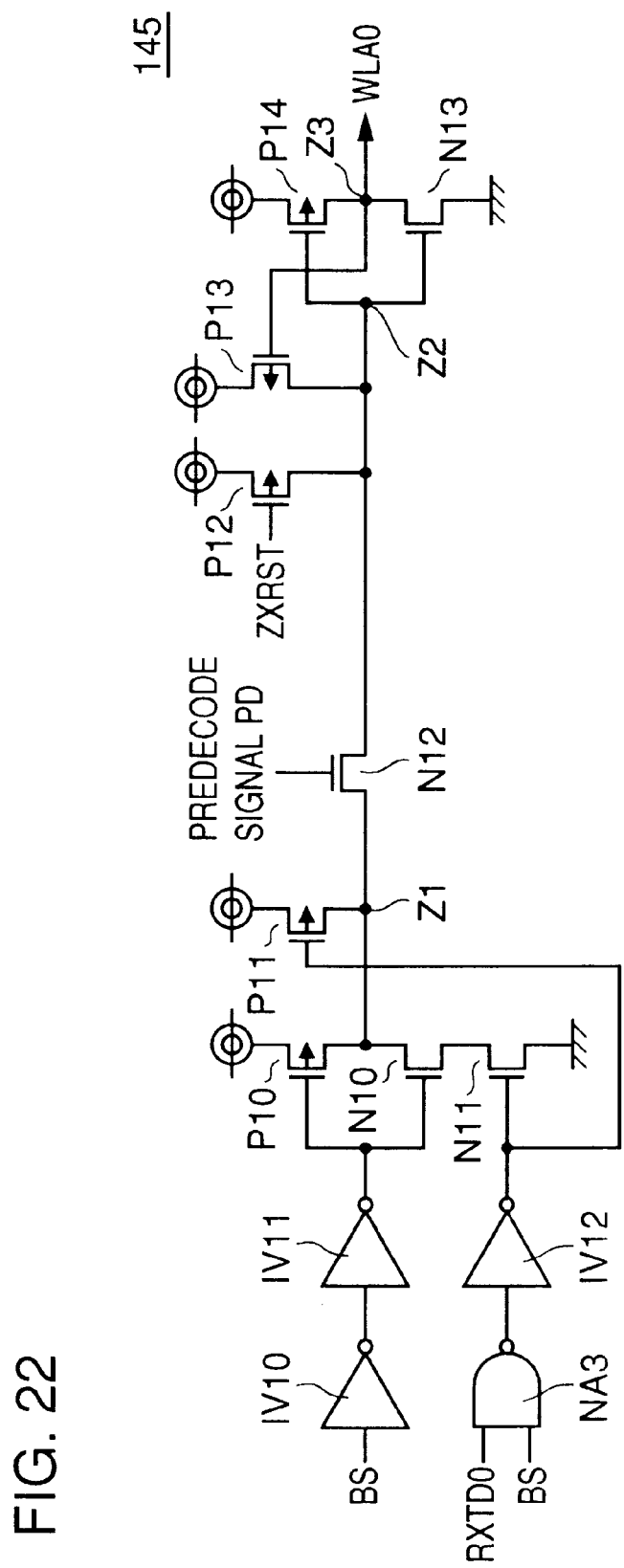
FIG. 22 shows a circuit configuration of a signal generation circuit 145.
Figure 23:
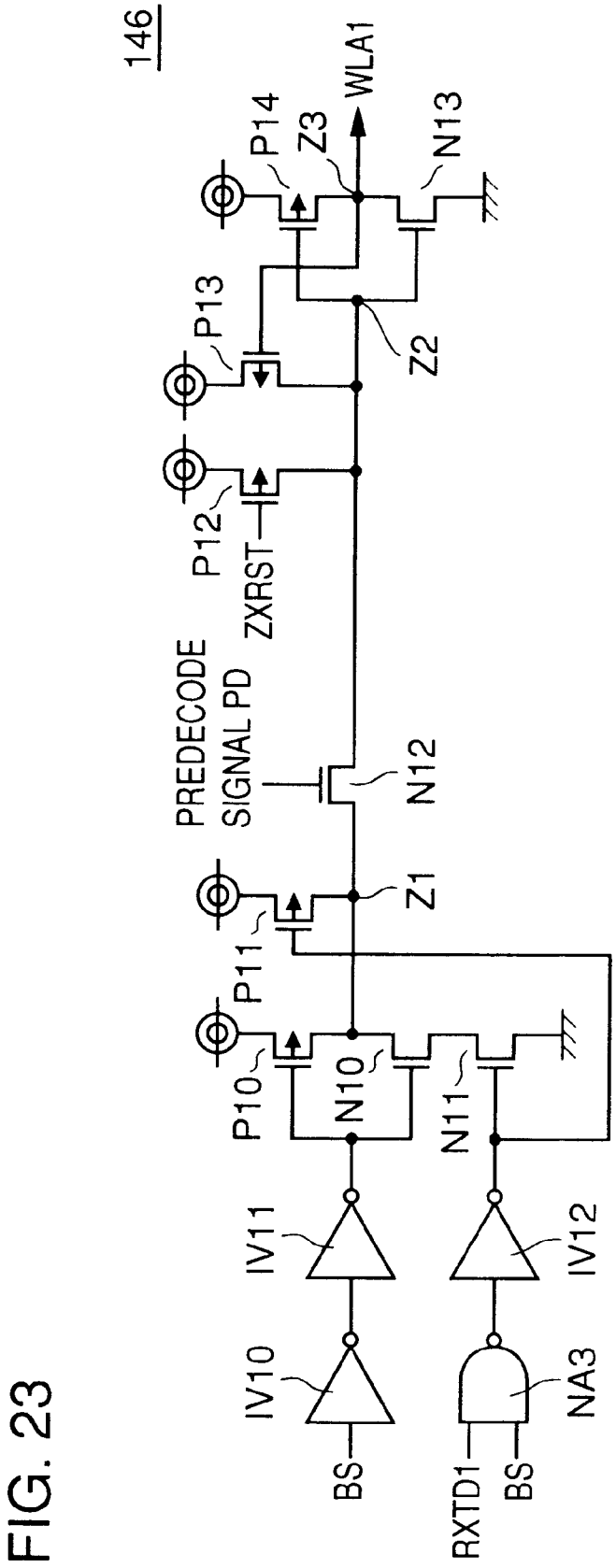
FIG. 23 shows a circuit configuration of a signal generation circuit 146.

Signal generation circuits 145 and 146, as shown in FIGS. 22 and 23, respectively, include inverters IV10–IV12, an NAND circuit NA3, and transistors P10–P14 and N10–N13. Transistors P10–P14 are PMOS transistors and transistors N10–N13 are NMOS transistors.

Inverter IV10 receives and inverts a corresponding block select signal BS. Inverter IVil inverts an output received from inverter IV10.

The signal generation circuit 145 NAND circuit NA3 receives signal RXTD0 and a corresponding block select signal BS. The signal generation circuit 146 NAND circuit NA3 receives signal RXTD1 and a corresponding block select signal BS.

Inverter IV12 inverts an output received from NAND circuit NA3.

Transistors P10, N10 and N11 are connected in series between a power supply voltage node and a ground voltage node GND. Transistors P10 and N10 have their respective gates receiving a signal output from inverter IV11 and transistor N11 has its gate receiving a signal output from inverter IV12.

Transistor P11 is connected between a node Z1 connecting transistors P10 and N10 and a power supply voltage node and it has its gate receiving a signal output from inverter IV12.

Transistor N12 is connected between nodes Z1 and Z2 and has its gate receiving predecode signal PD.

Transistor P12 is connected between node Z2 and a power supply voltage node and has its gate receiving reset signal ZXRST.

Transistors P14 and N13 are connected in series between a power supply voltage node and a ground voltage node GND and have their respective gates connected to node Z2.

A node Z3, connecting transistors P14 and N13 together, outputs a signal provided to drive a dummy word line. Transistor P13 is connected between node Z2 and a power supply voltage node and has its gate connected to node Z3.

When reset signal ZXRST is driven low, node Z2 attains the power supply voltage level, i.e., it is reset.

From the signal generation circuit 145 node Z3, signal WLA0 is output to drive dummy word line DWL0. From the signal generation circuit 146 node Z3, signal WLA1 is output to drive dummy word line DWL1.

A description will now be made of signal generation circuits 148#0–148#m provided for normal word lines. Signal generation circuit 148#m provided for normal word line WLm will be exemplarily described hereinafter.

Figure 24:
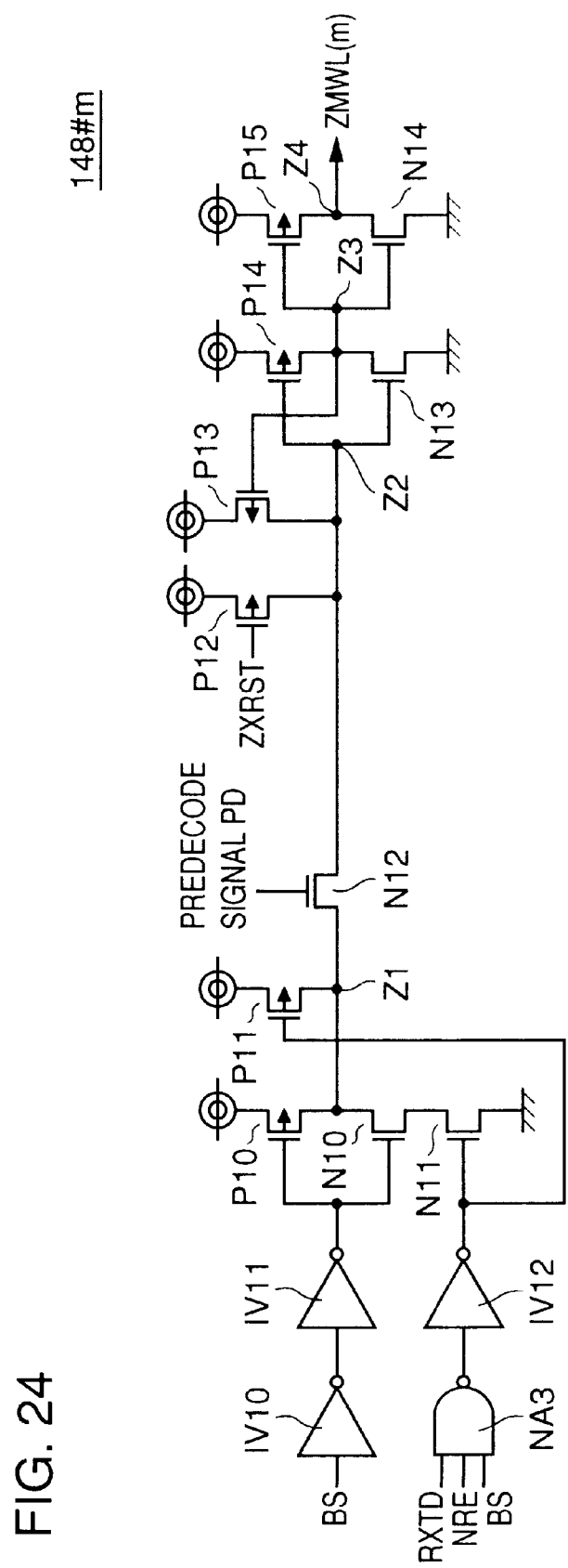
FIG. 24 shows a circuit configuration of a signal generation circuit 148#m.

Signal generation circuit 148#m, as shown in FIG. 24, includes inverters IV10–IV12, NAND circuit NA3, and transistors P10–P15 and N10–N14. Transistors P10–P15 are PMOS transistors and transistors N10–N14 are NMOS transistors.

Inverters IV10–IV12 and transistors P10–P14 and N10–N13 are connected in the same manner as in signal generation circuits 145, 146 provided for a dummy word line. It should be noted that NAND circuit NA3 receives signal RXTD, signal NRE, and a corresponding block select signal BS.

Transistors P15 and N14 are connected in series between a power supply voltage node and a ground voltage node GND and have their respective gates connected to node Z3. From a node Z4, connecting transistors P15 and N14 together, is output a signal ZMWL(m).

Normal word line WLm receives an inverted version of signal ZMWL(m). As such, when signal ZMWL(m) is driven low, normal word line WLm goes high.

Figure 25:
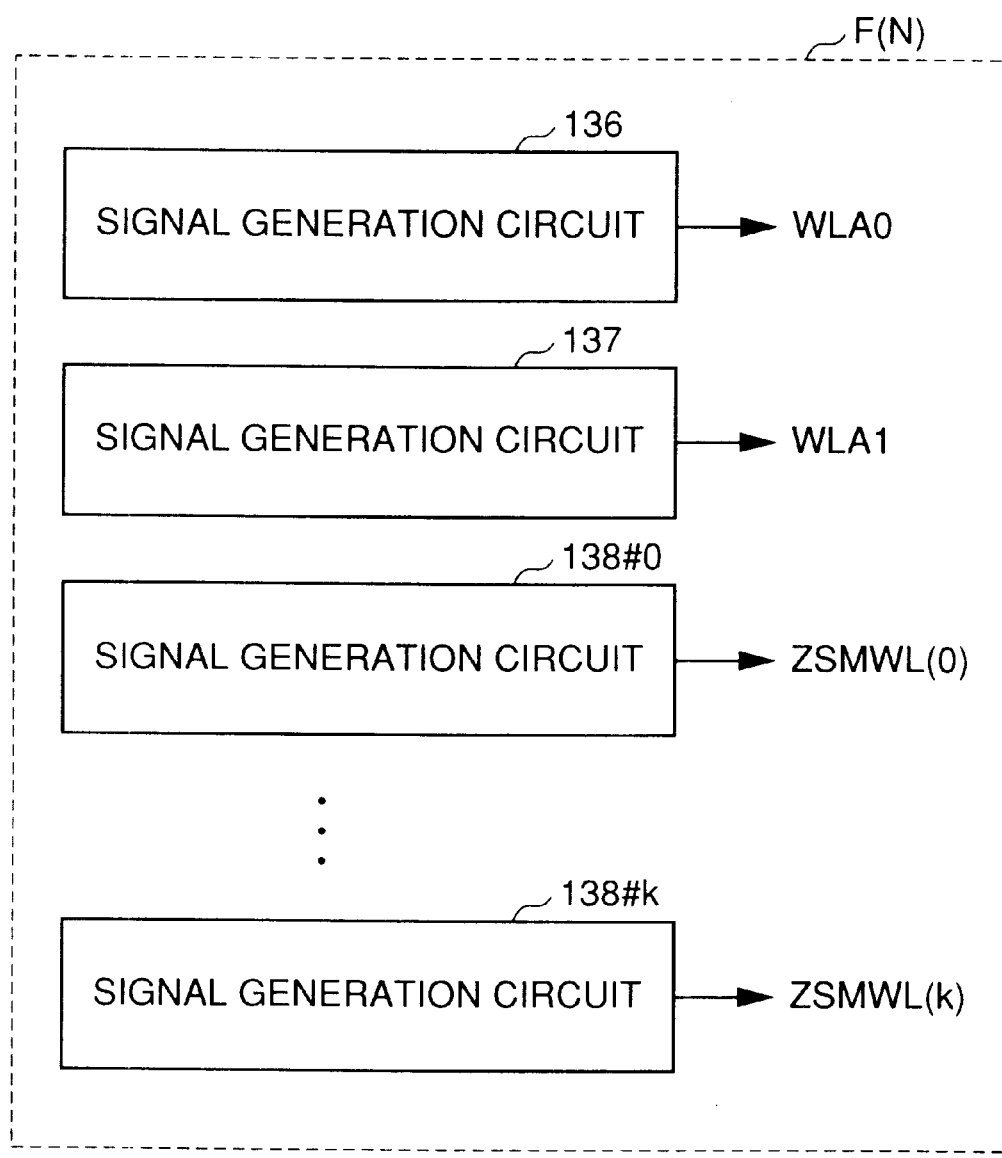
FIG. 25 is a block diagram showing a configuration of a select drive circuit F(N) in the 11th embodiment.

As has been description above, array block A(N) is provided with select drive circuit F(N), which, as shown in FIG. 25, includes a signal generation circuit 136 provided for dummy word line DWL0 and a signal generation circuit 137 provided for dummy word line DWL1.

Select dcive circuit F(N) also includes a plurality of signal generation cilcuits provided for their respective spare word lines. In the figure, signal generation circuits 138#0, 138#k are representatively shown, provided for spare word lines SWL0, SWLk.

Figure 26:
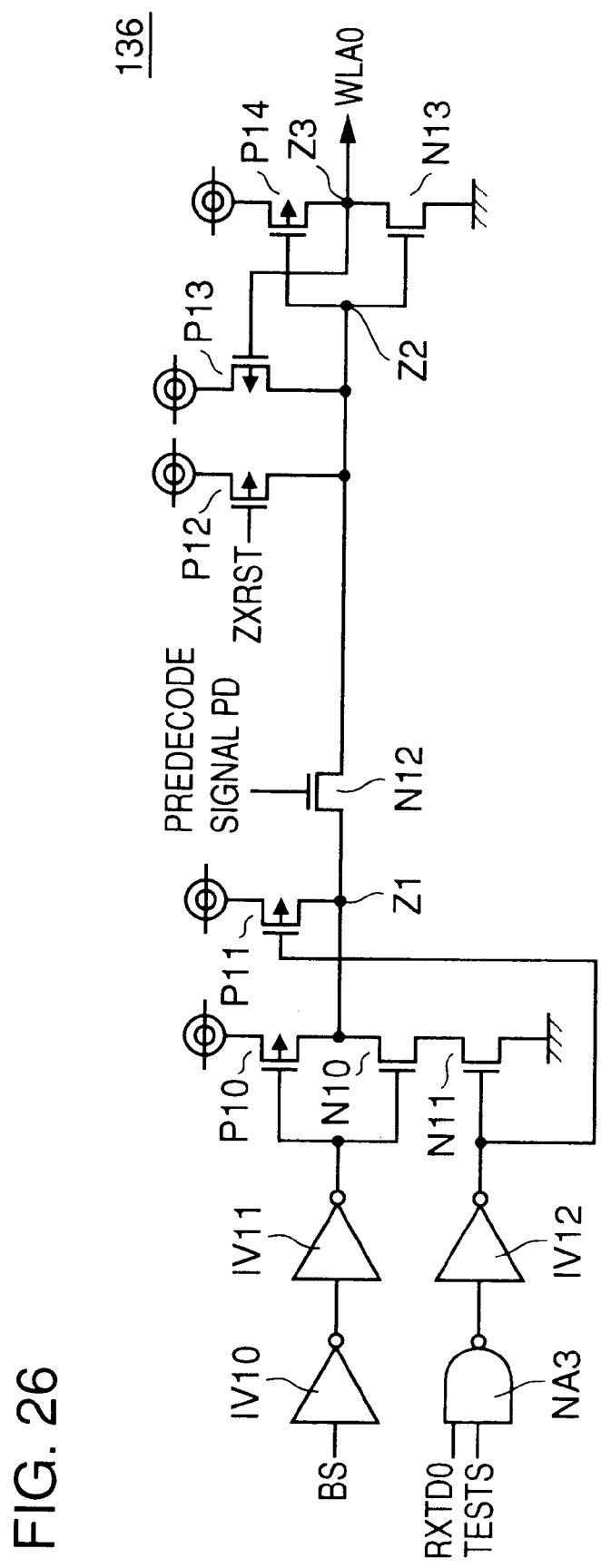
FIG. 26 shows a circuit configuration of a signal generation circuit 136.
Figure 27:
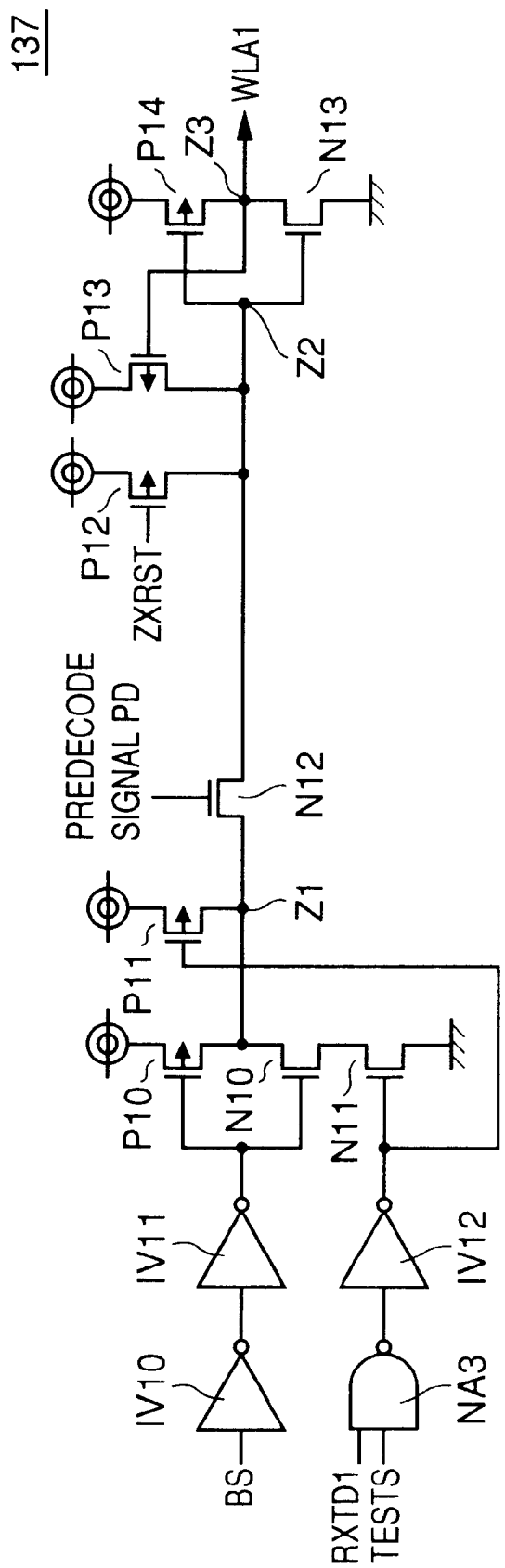
FIG. 27 shows a circuit configuration of a signal generation circuit 137.

Signal generation circuits 136 and 137, as shown in FIGS. 26 and 27, respectively, include inverters IV10–IV12, NAND circuit NA3, and transistors P10–P14 and N10–N13. Signal generation circuits 136, 137 are identical in configuration to signal generation circuits 145, 146.

The signal generation circuit 136 NAND circuit NA3 receives signal RXTD0 and test signal TESTS, and the signal generation circuit 137 NAND circuit NA3 receives signal RXTD1 and test signal TESTS.

In signal generation circuit 136 at node Z3 signal WLA0 is output to drive dummy word line DWL0, and in signal generation circuit 137 at node Z3 signal WLA1 is output to drive dummy word line DWL1.

A description will now be made of a signal generation circuit provided for a spare word line. Herein, signal generation circuit 138#k provided for spare word line SWLk will be exemplarily described.

Figure 28:
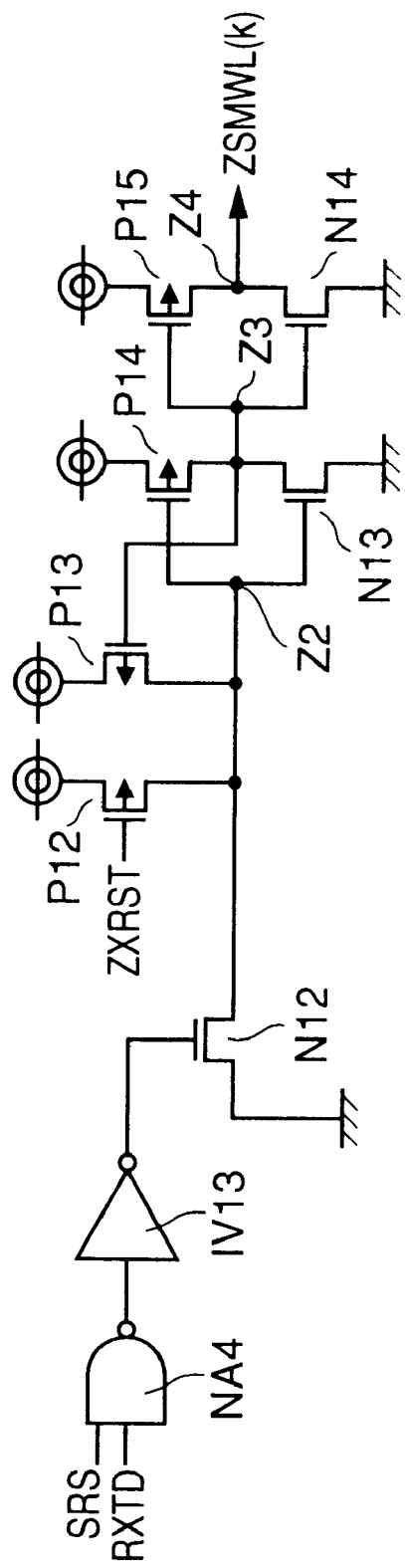
FIG. 28 shows a circuit configuration of a signal generation circuit 138#k.

Signal generation circuit 138#k, as shown in FIG. 28, includes an inverter IV13, an NAND circuit NA4, and transistors P12–P15 and N12–N14.

NAND circuit NA4 receives signal SRS of an array block corresponding thereto, and signal RXTD. Inverter IV13 inverts an output received from NAND circuit NA4. Transistor N12 is connected between ground voltage node GND and node Z2 and has its gate receiving a signal output from inverter IV13.

Transistors P12–P15 and N13–N14 are connected in the same relationship as in signal generation circuit 148#m. From node Z4, connecting transistors P15 and N14 together, is output a signal ZSMWL(k). Spare word line SWLk receives an inverted version of signal ZSMWL(k). As such, when signal ZSMWL(K) is driven low, spare word line SWLk goes high.

Figure 29:
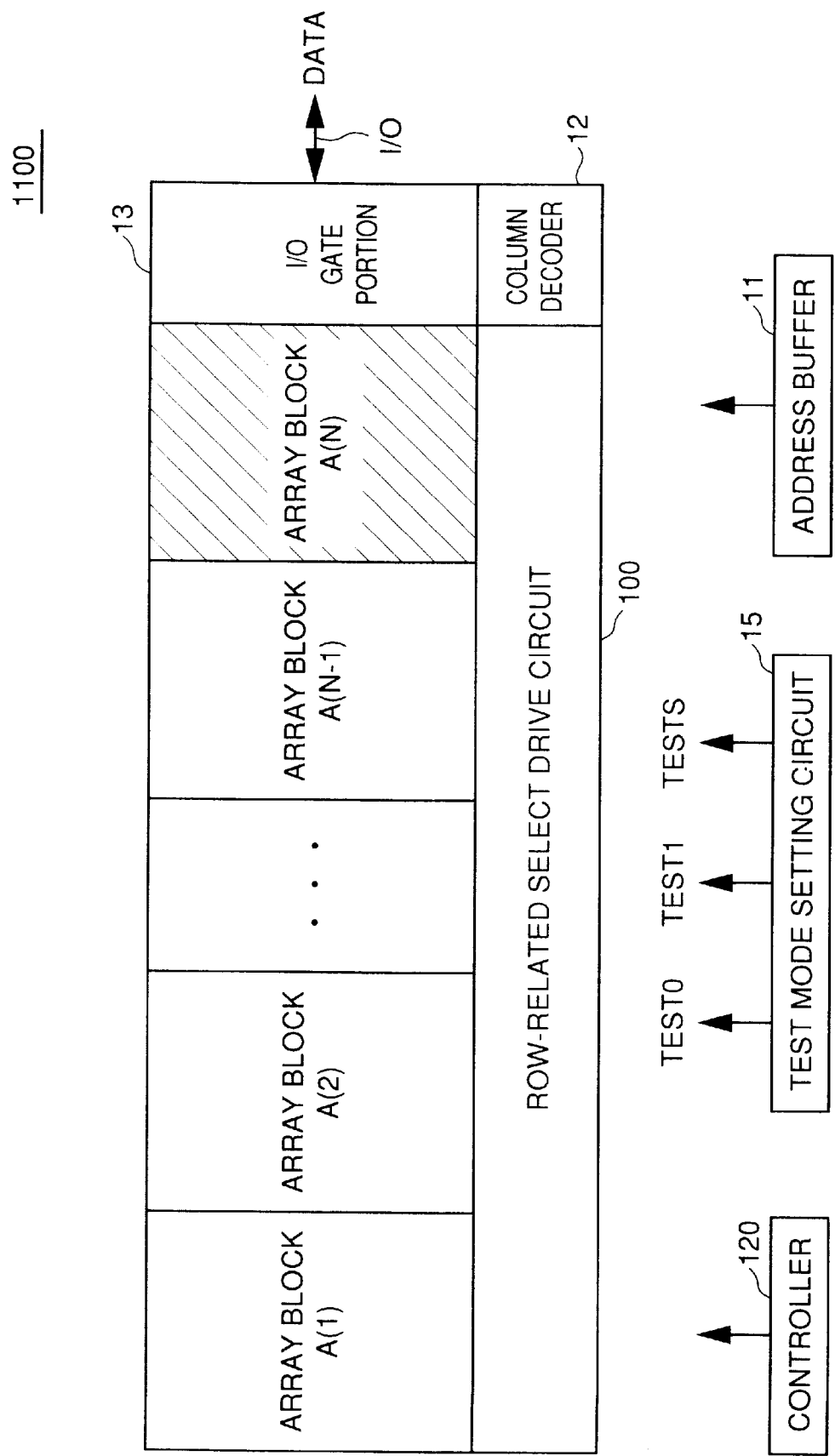
FIG. 29 is a block diagram showing a general configuration of a semiconductor memory device 1100 in the 11th embodiment.

Semiconductor memory device 1100 has a general configuration, as shown in FIG. 29. In the figure, row-related select drive circuit 100 includes the above described select drive unit 110.

A control circuit 120 receives an external control signal (e.g., a row address strobe signal /RAS, a column address strobe signal /CAS, a write enable signal IWE, and the like) and outputs an internal control signal designating an internal operation.

A test mode setting circuit 15 outputs test signals TEST0, TEST1, TESTS. In the end page read refresh, if test signal TEST0 is logical high then test signal TEST1 is driven low and if test signal TEST0 is logical low then test signal TEST1 goes high. Furthermore, when the test is conducted on array block A(N), test signal TESTS goes high. In a mode other than the end page read refresh, test signals TEST0, TEST1 TESTS are all held low.

It should be noted that test signals TEST0, TEST1, TESTS have their potentials determined by activating column address strobe signal /CAS and write enable signal /WE before activating row address strobe signal IRAS, i.e., the so-called WCBR condition, MRS (mode register set), and the like.

Row-related select drive circuit 100 responds to test signals TEST0, TEST1, TESTS received from test mode setting circuit 15, by activating a word line or a dummy word line.

In row select operation, signal RXT goes high. In the normal mode of operation, signal RXTD goes high or is activated and signals RXTD0 and RXTD1 are driven low or inactivated.

Row-related select drive circuit 100 compares an address input with an address programmed in fuse box 151. If signal NRE is logical high then in a selected array block a signal ZMWL(i) provided for normal word line WLi designated by predecode signal PD is driven low or activated. Thus, the corresponding normal word line WLi is driven high.

If signal SRS is logical high, signal ZSMWL(j) provided for spare word line SWLj substituting for a selected normal word line is driven low or activated. Thus, the corresponding spare word line SWLj is driven high.

When the end page read refresh mode is entered, one of test signals TEST0 and TEST1 goes high. Signal RXTD is driven low (or inactivated) and either one of signals RXTD0 and RXTD1 is driven high or activated. In response to signals RXTD0 and RXTD1, signal WLA0 or WLA1 for a selected array block goes high. Furthermore, if test signal TESTS is logical high then signal WLA0 or WLA1 for array block A(N) goes high.

Thus, in the 11th embodiment, a semiconductor memory device in the normal mode of operation allows a flexible redundancy configuration to provide substitution and in the end page read refresh can use a dummy word line to reliably test the memory.

12th Embodiment

A 12th embodiment provides a testing configuration in a semiconductor memory device having a redundant configuration other than a flexible redundancy configuration.

Array blocks are labeled B(1)–B(N). The array blocks each include a plurality of normal word lines and a single spare word line. A defective word line is substituted with a spare word line included in the same array block. The spare word line included in each array block is labeled SVWL.

Furthermore, array blocks B(1)–B(N) each include dummy word lines DWL0, DWL1. As has been described in the third or eighth embodiment, the dummy word line has connected thereto a transistor (1a or 1b, or 2a or 2b) driving a bit line's potential.

Figure 30:
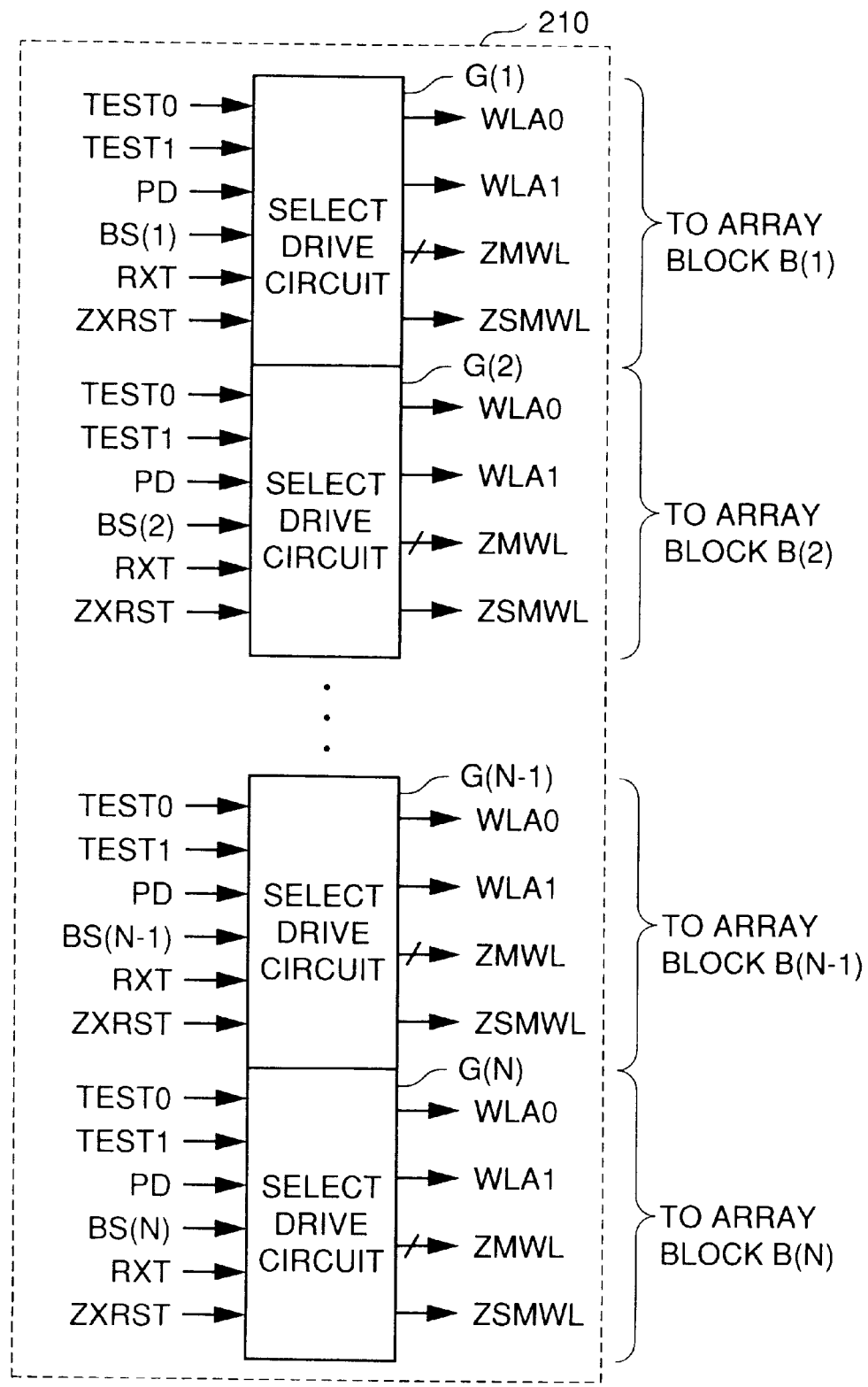
FIG. 30 is a block diagram showing a configuration of a select drive unit 210 in a 12th embodiment of the present invention.

The 12th embodiment provides a semiconductor memory device 1200, which includes a row-related select drive circuit, as will be described hereinafter. Semiconductor memory device 1200, as shown in FIG. 30, includes a select dlive unit 210 having select drive circuits G(l)–G(N). Select drive circuits G(1)–G(N) are provided for array blocks B(1)–B(N), respectively.

Select drive circuit G(i), wherein i=1 to N, receives test signals TEST0 and TEST1 used in conducting the end page read refresh, a predecode signal PD designating a word line to be activated, a block select signal BS(i), a signal RXT designating a row select operation, and a reset signal ZXRST provided to reset a word line.

Select drive circuit G(i), wherein i=1 to N, outputs signal ZMWL provided to drive a normal word line of array block B(i), signal ZSMWL provided to drive a spare word line of array block B(i), signal WLA0 provided to drive dummy word line DWL0 of array block B(i), and signal WLA1 provided to drive dummy word line DWL1 of array block B(i).

Figure 31:
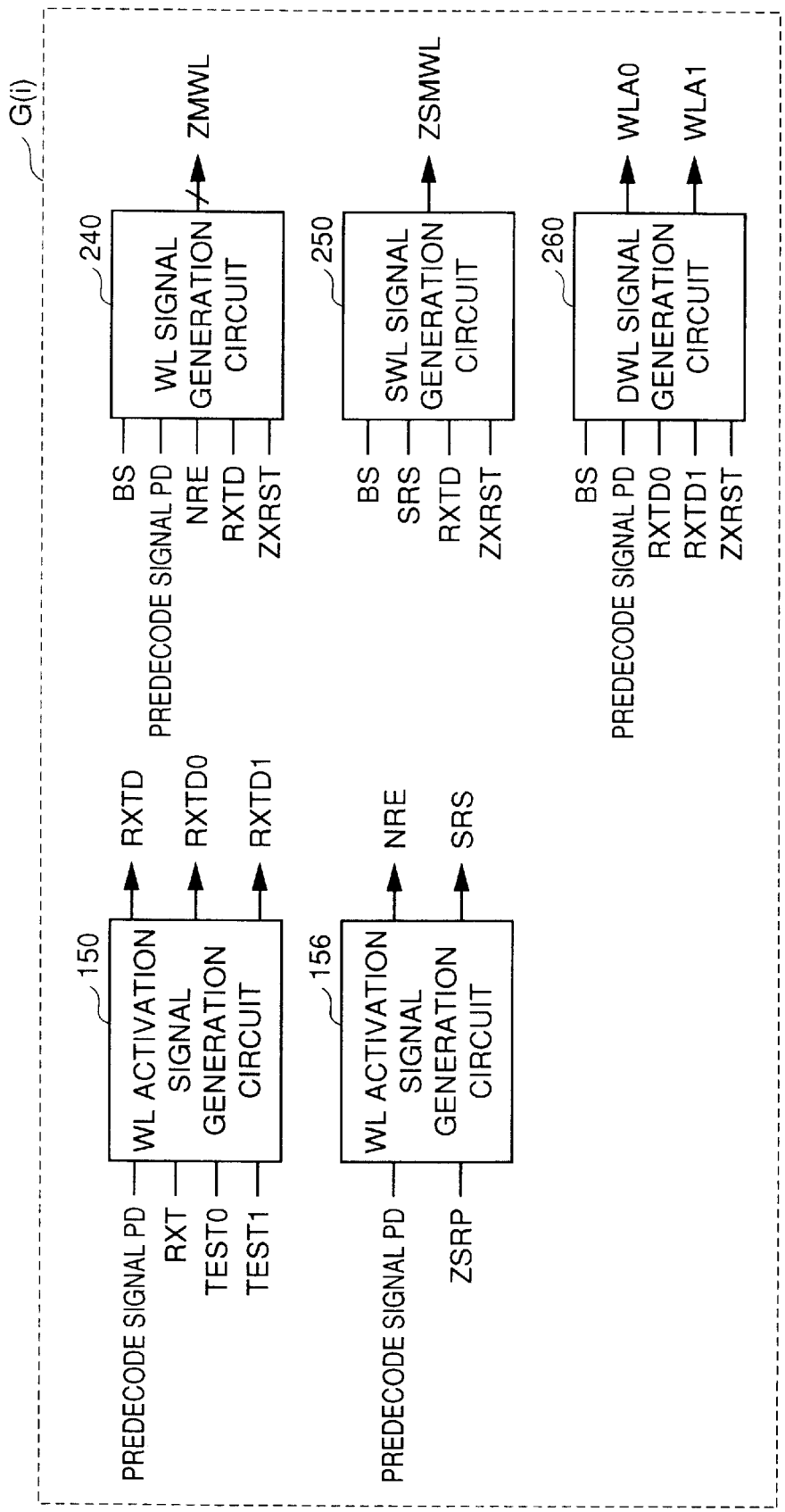
FIG. 31 is a block diagram showing a configuration of a select drive circuit G(i) in the 12th embodiment, wherein i=1 to N.

Select drive circuit G(i), wherein i=1 to N, as shown in FIG. 31, includes WL activation signal generation circuits 150 and 156, a WL signal generation circuit 240, an SWL signal generation circuit 250, and a DWL signal generation circuit 260.

WL activation signal generation circuits 150 and 156 are configured as has been described in the 11th embodiment.

WL signal generation circuit 240 outputs signal ZMWL in response to a corresponding block select signal BS, signal NRE, signal RXTD, predecode signal PD and reset signal ZXRST. Block select signal BS represents block select signals BS(1), . . . .

SWL signal generation circuit 250 outputs signal ZSMWL in response to a corresponding block select signal BS, signal SRS, signal RXTD and reset signal ZXRST.

DWL signal generation circuit 260 outputs signals WAL0, WAL1 in response to a corresponding block select signal BS, signals RXTD0, RXTD1, predecode signal PD and reset signal ZXRST.

Figure 32:
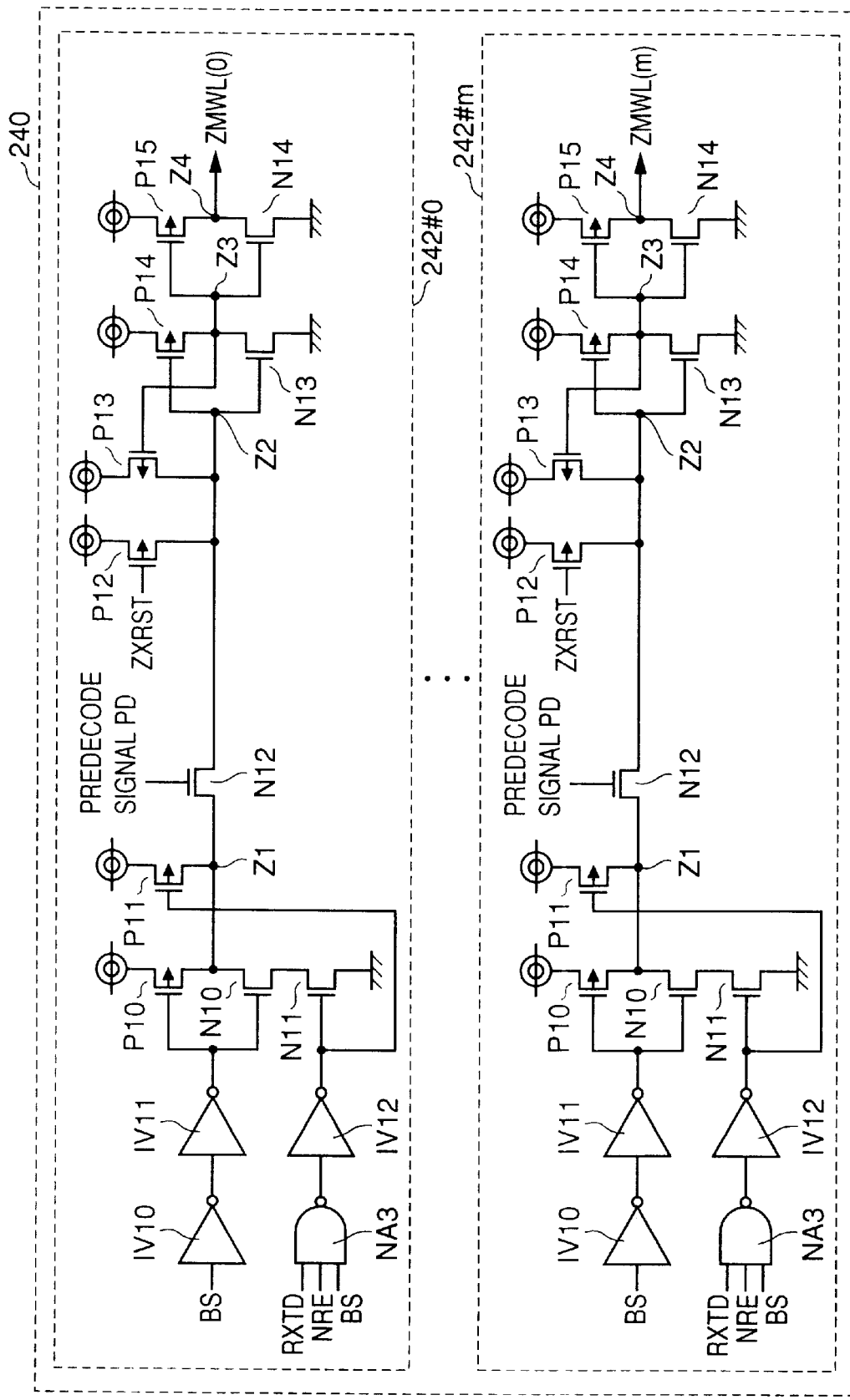
FIG. 32 shows a configuration of a WL signal generation circuit 240.

WL signal generation circuit 240, as shown in FIG. 32, includes a plurality of signal generation circuits provided for their respective normal word lines. In the figure, there are representatively shown a signal generation circuit 242#0 provided for normal word line WL0 and a signal generation circuit 242#m provided for normal word line WLm.

A signal generation circuit provided for a normal word line will now be described by referring as an example to signal generation circuit 242#m provided for normal word line WLm.

Signal generation circuit 242#m includes inverters IV10–IV12, NAND circuit NA3, and transistors P10–P15 and N10–N14.

Inverters IV10–IV12 and transistors P10–P15 and N10–N14 are connected in the relationship as provided in the signal generation circuit provided for a normal word line in the 11th embodiment. It should be noted that NAND circuit NA3 receives signal RXTD, signal NRE, and a corresponding block select signal BS. From node Z4, connecting transistors P15 and N14 together, is output signal ZMWL(m).

Normal word line WLm receives an inverted version of signal ZMWL(m). As such, when signal ZMWL(m) is driven low, normal word line WLm goes high.

Figure 33:
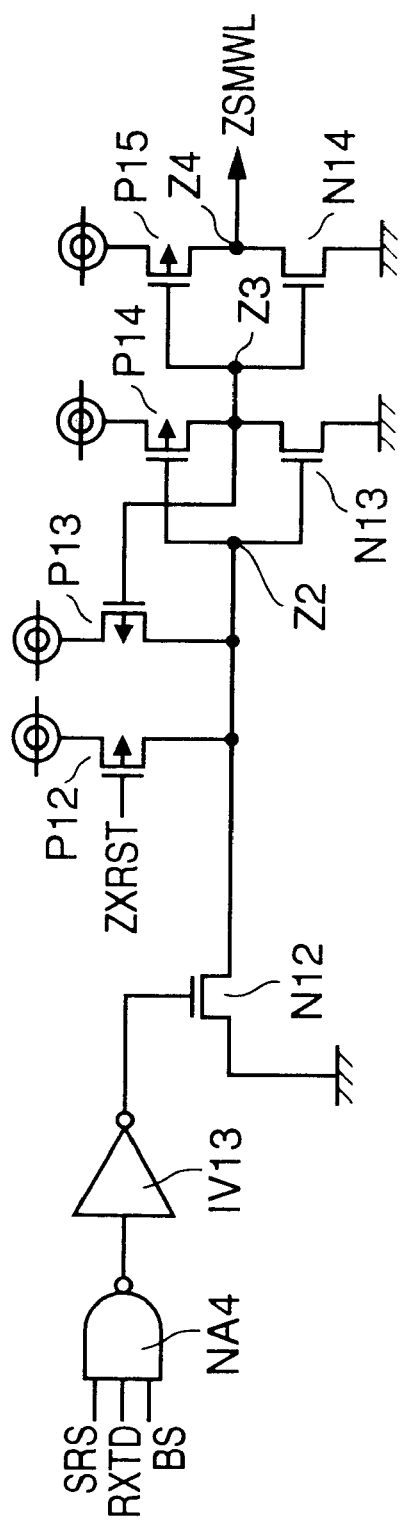
FIG. 33 shows a configuration of a SWL signal generation circuit 250.

SWL signal generation circuit 250, as shown in FIG. 33, includes inverter IV13, NAND circuit NA4, and transistors P12–PI5 and N12–N14. They are connected in the relationship as provided in the signal generation circuit provided for a spare word line in the 11th embodiment. It should be node that NAND circuit NA4 receives signal SRS, block select signal BS and signal RXTD.

Figure 34:
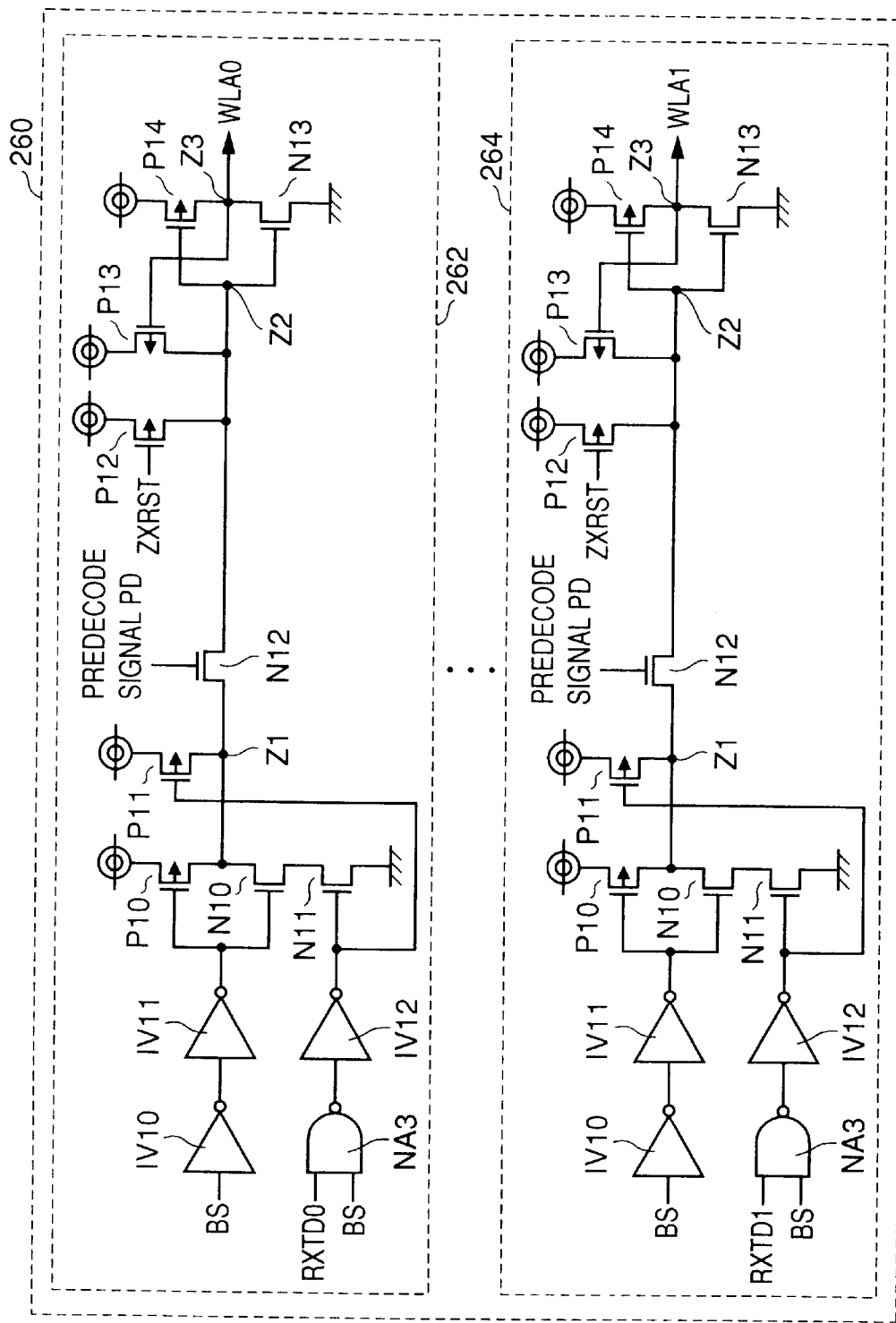
FIG. 34 shows a configuration of a DWL signal generation circuit 260.

DWL signal generation circuit 260, as shown in FIG. 34, includes a signal generation circuit 262 provided for dummy word line DWL0 and a signal generation circuit 264 provided for dummy word line DWL1.

Signal generation circuits 262 and 264 each include inverters IV10–IV12, NAND circuit NA3, and transistors P1O–P14 and N10–N13. They are connected in the relationship as provided in signal generation circuits 145, 146, as has been described above.

The signal generation circuit 262 NAND circuit NA3 receives signal RXTD0 and block select signal BS, and the signal generation circuit 264 NAND circuit NA3 receives signal RXTD1 and block select signal BS.

In signal generation circuit 262 at node Z3 is output signal WLA0, and in signal generation circuit 264 at node Z3 is output signal WLA1.

Figure 35:
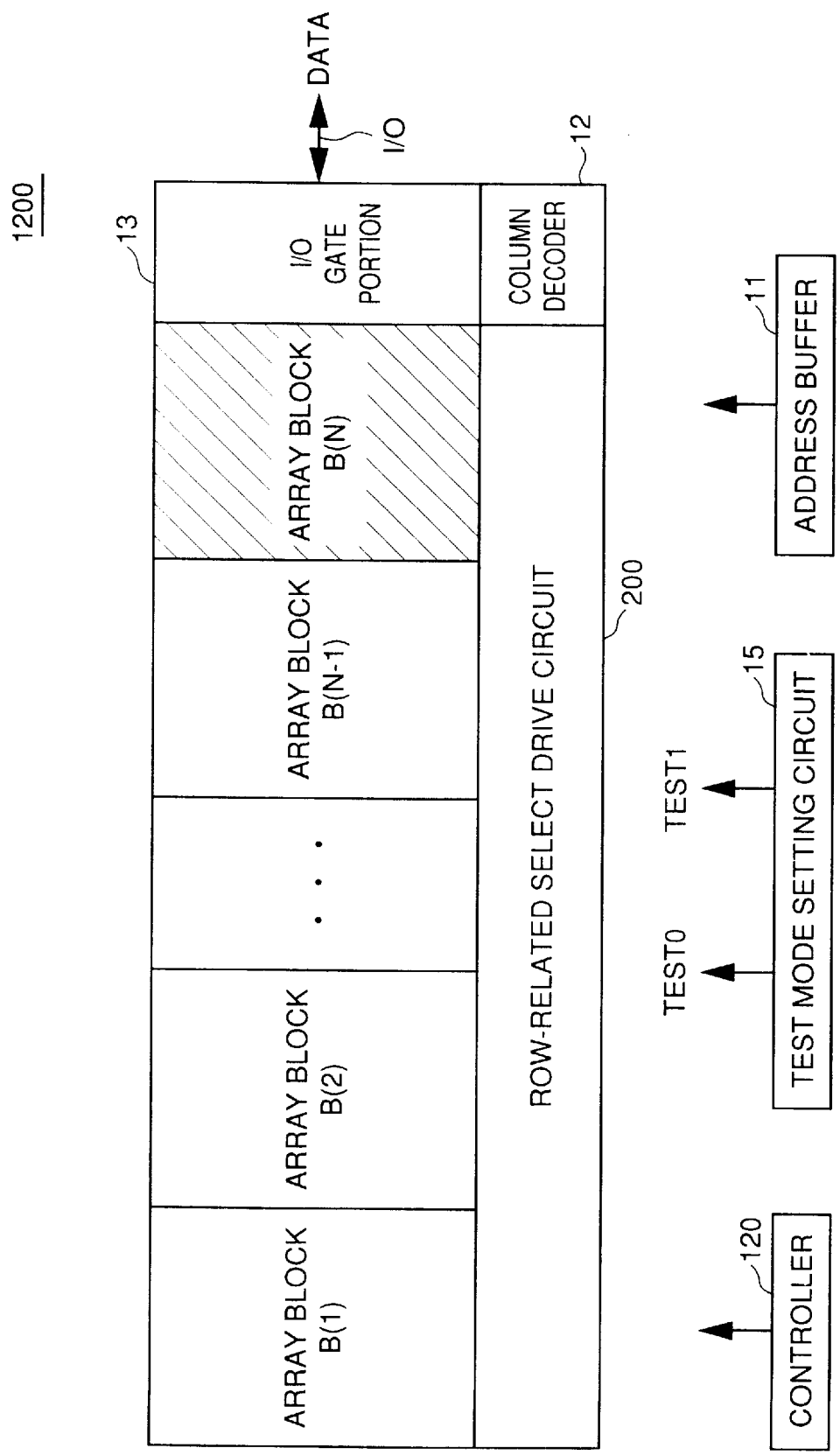
FIG. 35 is a block diagram showing a general configuration of a semiconductor memory device 1200 in the 12th embodiment.

Semiconductor memory device 1200 is generally configured, as shown in FIG. 35. In the figure, row-related select drive circuit 200 includes select drive unit 210 as described above.

Row-related select drive circuit 200 responds to test signals TEST0 and TEST1 received from test mode setting circuit 15, by activating a word line or a dummy word line. In the end page read refresh mode, if test signal TEST0 is logical high then test signal TEST1 is driven low and if test signal TEST0 is logical low then test signal TEST1 is driven high. In a mode other than the end page read refresh, test signals TEST0 and TEST1 are both held low.

In row select operation, signal RXT goes high. In the normal mode of operation, signal RXTD goes high or is activated and signals RXTD0 and RXTD1 are driven low or inactivated.

Row-related select drive circuit 200 compares an address input with an address programmed in fuse box 151. If signal NRE is logical high then in a selected array block a signal ZMWL(i) provided for normal word line WLi designated by predecode signal PD is driven low or activated. Thus, the corresponding normal word line WLi is driven high.

If signal SRS is logical high, signal ZSMWL(j) provided for spare word line SWLj substituting for a selected normal word line is driven low or activated. Thus, the corresponding spare word line SWLj is driven high.

When the end page read refresh mode is entered, one of test signals TEST0 and TEST1 goes high. Signal RXTD is driven low (or inactivated) and either one of signals RXTD0 and RXTD1 is driven high or activated. In response to signal RXTD0 or RXTD1, signal WLA0 or WLA1 for a selected array block goes high.

Thus, in the 12th embodiment, a semiconductor memory device in the normal mode of operation allows a redundant configuration other than a flexible redundancy configuration to provide substitution and in the end page read refresh can use a dummy word line to reliably test the memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array portion including a plurality of memory cells arranged in rows and columns, a plurality of normal word lines provided corresponding to a plurality of rows, a plurality of bit lines provided corresponding to a plurality of columns, and a spare word line provided for substituting for a defective normal word line of said plurality of normal word lines;

a test circuit including a dummy word line and a drive circuit operating to amplify a voltage level of said plurality of bit lines corresponding to an activated dummy word line;

a decision circuit referring to an address input, to determine whether or not to substitute a selected normal word line with said spare word line; and a select drive circuit operating in a test mode to selectively drive said dummy word line rather than said plurality of normal word lines and said spare word line, and operating in a mode other than said test mode to refer to a decision of said decision circuit to selectively drive a corresponding normal word line or a corresponding spare word line.

2. The semiconductor memory device according to claim 1, wherein said drive circuit includes a plurality of transistors arranged for said plurality of bit lines, respectively, said plurality of transistors each responding to a potential of said dummy word line by driving a corresponding bit line to a predetermined potential.

3. The semiconductor memory device according to claim 2, wherein said predetermined potential is determined depending on data written to a memory cell.

4. The semiconductor memory device according to claim 2, wherein:

said memory cell stores either one of data having a level slightly higher than a level intermediate between a ground potential and a power supply potential and data having a level slightly lower than a level intermediate between said ground potential and said power supply potential; and said plurality of transistors each drive said corresponding bit line to said ground potential.

5. The semiconductor memory device according to claim 2, wherein:

said memory cell stores either one of data having a level slightly higher than a level intermediate between a ground potential and a power supply potential and data having a level slightly lower than a level intermediate between said ground potential and said power supply potential; and said plurality of transistors each drive said corresponding bit line to said power supply potential.

6. The semiconductor memory device according to claim 1, further comprising a dummy formation region formed at an outermost periphery of a region provided with said memory cell array portion, wherein said test circuit is provided in said dummy formation region.

7. The semiconductor memory device according to claim 2, further comprising a dummy formation region provided at an outermost periphery of a region provided with said memory cell array portion, wherein said plurality of transistors are provided in said dummy formation region.

8. The semiconductor memory device according to claim 1, wherein:

said plurality of normal word lines are divided into a plurality of array blocks; and in a mode other than said test mode, said defective normal word line in each of said plurality of array blocks is substituted by said spare word line arranged in a spare block formed in a region different from said plurality of array blocks.

9. The semiconductor memory device according to claim 8, wherein said drive circuit is arranged only in said plurality of array blocks.

10. The semiconductor memory device according to claim 1, wherein:

there are provided more than one said spare word line;

said plurality of memory cells, said plurality of normal word lines and said more than one spare word line are divided in a plurality of array blocks; and said defective normal word line in each of said plurality of array blocks is substituted by a spare word line existing in the same array block.

11. The semiconductor memory device according to claim 2, further comprising a test mode setting circuit operable to set said test mode, wherein said select drive circuit operates to allow said plurality of transistors to be operable only in said test mode.

* * * * *

UNITED STATES PATENT AND TRADEMARK OFFICE
CERTIFICATE OF CORRECTION

PATENT NO. : 6,504,744 B2
DATED : January 7, 2003
INVENTOR(S) : Aritomi et al.

It is certified that error appears in the above-identified patent and that said Letters Patent is hereby corrected as shown below:

Title page,
Item [*] Notice, should read -- Subject to any disclaimer, term of this patent is extended or adjusted under 35 USC 154(b) by 0 days --

Signed and Sealed this

Fifth Day of October, 2004

JON W. DUDAS
*Director of the United States Patent and Trademark Office*